United States Patent [19]
Strong

[11] Patent Number: 6,166,566
[45] Date of Patent: *Dec. 26, 2000

[54] ADAPTIVE THRESHOLD CIRCUIT FOR COMPARATORS

[75] Inventor: Alexander M. Strong, San Jose, Calif.

[73] Assignee: Linear Technology Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/970,994

[22] Filed: Nov. 14, 1997

[51] Int. Cl.$^7$ .................................................. H03K 5/153
[52] U.S. Cl. ............................................ 327/72; 327/307
[58] Field of Search ................................ 327/72, 73, 74, 327/75, 77, 68, 205, 206, 362, 307; 359/189, 194; 250/214 R, 214 A

[56] References Cited

U.S. PATENT DOCUMENTS

| | | | |
|---|---|---|---|
| 5,025,456 | 6/1991 | Ota et al. | 327/72 |
| 5,075,792 | 12/1991 | Brown et al. | 359/152 |
| 5,272,394 | 12/1993 | Kirk et al. | 327/58 |
| 5,307,196 | 4/1994 | Kinoshita | 359/189 |
| 5,703,504 | 12/1997 | Chun et al. | 327/72 |
| 5,712,475 | 1/1998 | Ohno | 327/72 |

OTHER PUBLICATIONS

Linear Databook Supplement 1992 at pp. 10–7 to 10–14, published by Linear Technology Corporation, Milpitas, California in 1992.

Dennis Rogers, et al., "A Single Chip Transceiver for infrared Communications," Proc. IEEE Bipolar/BiCMOS Circuites and Technology Meeting 1997, pp. 177–179, 1997.

"HSDL–1100 Infrared Transceiver —Technical Data," published by the Hewlett–Packard Company, copyright 1996.

Draft Infrared Data Association Serial Infrared Phiysical Layer Specification, Ver. 1,1e, App. B, Oct. 1995.

"IrDA Data Link Design Guide," pp. 11–23, 33–43 and 63–68, published by the Hewlett–Packard Company, copyright Jul. 1995.

"HSDL–1000 Infrared IrDA Compliant Transceiver," published by the Hewlett–Packard Company, copyright Apr. 1995.

"HPSIR Serial Infrared Communications Hardware Design Guide," published by the Hewlett–Packard Company (Date uncertain).

"HSDL–1100 Infrared Transceiver —Preliminary Technical Data," pp. 1–7, published by the Hewlett–Packard Company, (Date uncertain).

*Primary Examiner*—Toan Tran
*Attorney, Agent, or Firm*—Fish & Neave; Steven J. Cahill; Mark D. Rowland

[57] ABSTRACT

The invention provides adaptive threshold circuits for comparators, whereby the threshold voltage adapts to characteristics of the input signal. In one embodiment, the steady-state threshold voltage stored on a peak-detector capacitor is generated by ratioing the base-emitter voltages of two emitter-follower transistors. As the input signal varies, the threshold voltage follows the input signal. Voltage-controlled current sources sense the amplitude of the input signal, and adjust the amplitude of the threshold voltage by controlling the voltage dropped across a resistor. A feedback signal that indicates the state of the comparator output is coupled to the adaptive threshold circuit to provide hysteresis. In another embodiment, the threshold voltage is determined by the voltage drop across a first resistor. Voltage-controlled current sources sense the amplitude of the input signal, and adjust the amplitude of the threshold voltage by controlling the voltage dropped across a second resistor.

47 Claims, 15 Drawing Sheets

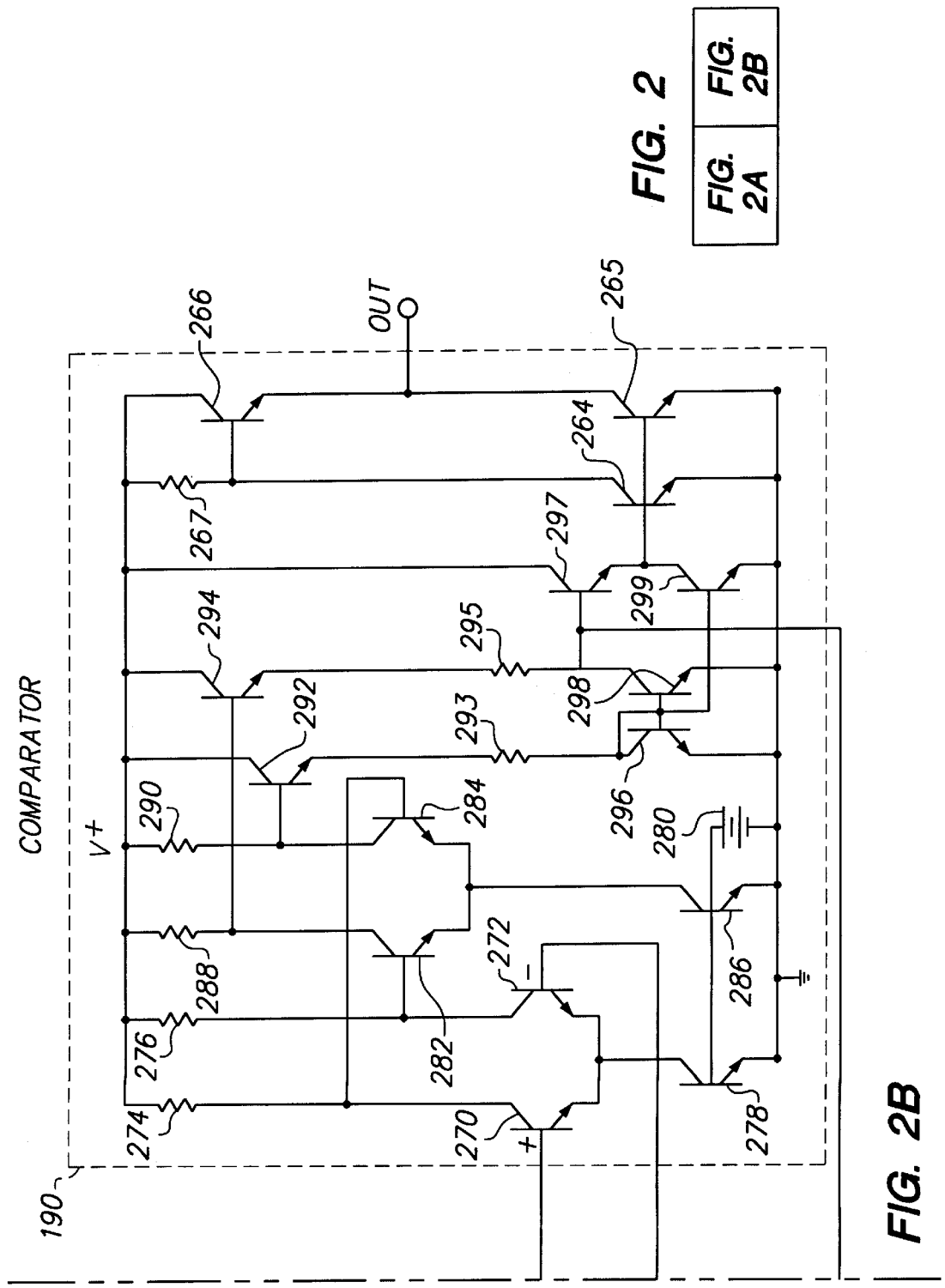

ADAPTIVE THRESHOLD CIRCUIT FOR COMPARATORS

BACKGROUND OF THE INVENTION

The present invention relates to threshold circuits for comparators. More particularly, the present invention relates to novel adaptive threshold circuits for generating the threshold voltage for comparators that compare an input signal to a threshold voltage, whereby the generated threshold voltage adapts to characteristics of the input signal. Even more particularly, the present invention relates to adaptive threshold circuits capable of adapting the threshold voltage to the output of a photo diode preamplifier.

In many digital communication systems, a photo diode receiver is used to detect lightwave pulses transmitted by a light emitting diode ("LED"). The photo diode typically provides an input current to a preamplifier, which converts the input current to voltage and adds modest gain. A comparator reconstructs the received pulses by comparing the preamplifier output voltage with a threshold voltage. Such photo diode receivers typically operate over a wide range of frequencies, pulse amplitudes, and ambient light conditions.

Because a photo diode's current is proportional to incident light, ambient light can cause large DC offsets and unwanted low frequency AC signals at the preamplifier output. To compensate for such undesired effects, photo diode receivers typically employ a transconductance block in conjunction with the preamplifier, forming a servo loop. The transconductance block feeds a current back into the preamplifier input so that the preamplifier output equals a preset bias level when no lightwave pulses are received.

To reconstruct received pulses, the comparator's negative input is coupled to the preamplifier output, and the comparator's positive input is connected to a threshold voltage that is set to a level half-way between the preset bias level and some predetermined minimum pulse amplitude. The comparator's output changes from HIGH-to-LOW whenever the preamplifier output voltage exceeds the threshold voltage, and changes from LOW-to-HIGH whenever the preamplifier output voltage falls below the threshold voltage. In this configuration, any DC offset at the preamplifier output appears as a differential-mode offset at the comparator's input terminals. Ideally, the servo loop cancels out any DC and low frequency components of the photo diode output signal such that the comparator passes only pulses above the threshold voltage.

The servo loop does not, however, cancel DC offset generated in the transconductance block. The transconductance block typically has an input stage including a highly degenerated differential amplifier that has wide dynamic range, but also has a large input-referred DC offset. This offset appears unattenuated at the preamplifier output and may be of the same order of magnitude as the amplified photo diode pulses. If the photo diode receiver must capture low level signals, this DC offset at the preamplifier output may be greater than the threshold voltage. As a result, the comparator may not capture any pulses because the preamplifier's output signal will likely never cross the threshold voltage. Typically, a trim circuit reduces such offset errors by adding a compensating offset to the transconductance block input. A problem with this approach, however, is that each circuit individually must be adjusted, or "trimmed," thus increasing time and expense during the manufacturing process.

Furthermore, typical "fixed threshold with trim" circuits often cannot adapt to certain unique characteristics of photo diodes. At high pulse amplitudes, the photo diode conducts a non-zero current for a period of time after the received light pulse has ended. As a result of this current, the preamplifier output exhibits a small sharp drop at the end of the pulse (the "sharp cutoff region") followed by a relatively slower decay (the "tail region") down to a DC level. If the photo diode receiver operates over a wide frequency range and pulse amplitude range, it is possible that the tail region from one pulse will not decay below the preset threshold voltage before the next pulse is received. If this occurs, the comparator may once again fail to properly detect received pulses. Further, even if the tail region decays below the threshold voltage, the reconstructed pulse width will be longer than the received lightwave pulse width.

One way to counteract these DC offset errors is to replace the "fixed threshold with trim" circuit with a circuit that provides an adaptive trigger threshold, such as the Fast Single Supply Adaptive Trigger circuit shown and described in FIG. 3 at page 10–13 in the 1992 Linear Databook published by Linear Technology Corporation of Milpitas, California. That adaptive trigger circuit sets the comparator threshold voltage at the midpoint of the input signal's highest and lowest peak amplitudes. The circuit uses two peak detectors to capture on two capacitors the input signal's high peak and low peak (lowest level). A pair of high-valued series-connected resistors are connected to the two capacitors and are used to (1) set the discharge time for the high peak capacitor and the charge time for the low peak capacitor, and (2) form a voltage divider that sets the threshold voltage between the voltages on the two capacitors. The adaptive trigger circuit removes the need for a trim circuit because the threshold voltage is not set to a fixed level, but adapts to the signal with which it is being compared.

One drawback of the foregoing adaptive trigger circuit, however, is that it requires an initial peak to set the threshold voltage. Because the initial threshold voltage equals the steady state DC input signal amplitude, the comparator's response to the first pulse is unpredictable. Further, the foregoing adaptive trigger circuit requires large valued resistors to maintain a large discharge time for the high peak capacitor and a large charge time for the low peak capacitor, so that the threshold voltage remains for an adequate duration at a voltage midway between the input signal's high and low peaks.

Moreover, if the foregoing adaptive trigger circuit receives no lightwave pulses during a steady-state period and then suddenly receives large valued photo diode pulses, the low peak capacitor slowly charges upwards from the initial bias signal level to the lowest "tail" level. In this instance, the threshold voltage just after receiving the initial high amplitude pulse is set to a level midway between the high peak and the initial bias level. During the slow charging period, the threshold voltage increases slowly above that midpoint, which may be below or in the tail region of the diode's response characteristics. If the former, the comparator may not trigger on pulses received during this time period, and if the latter, the comparator produces pulses of substantially greater pulse width than that of the received pulses.

The distance between the LED and the photo diode typically may range from 1 cm to 1 meter. If the photo diode and LED are so close that they touch, the photo diode tends to generate a high amplitude current with a distorted pulse width. If the threshold voltage in the foregoing adaptive trigger circuit is set too far below the preamplifier's peak output, the comparator's output pulse width will also be much greater than that of the received light pulse. The foregoing problems cannot reliably be solved by ratioing the resistors to increase the threshold voltage above the midpoint. At minimum signal levels, such an adjustment would likely increase false triggering of the comparator output, and thereby decrease the receiver's noise immunity.

In view of the foregoing, it would be desirable to provide for use with a comparator an improved adaptive threshold circuit that has a first or low threshold voltage for triggering low input signal pulses of the type that might be generated by a photo diode, and that for higher input signal levels adapts the trigger level such that the photo diode's unique output current characteristics do not undesirably alter the triggering of the comparator.

It also would be desirable to provide for use with a comparator an improved adaptive threshold circuit for producing a variable threshold voltage such that the comparator correctly responds to the initial pulse.

It also would be desirable to provide for use with a comparator an improved adaptive threshold circuit that provides low differential-mode DC offset at the comparator inputs.

It also would be desirable to provide an adaptive threshold circuit that operates over a wide range of input signal frequencies and pulse amplitudes.

It also would be desirable to provide for a comparator an adaptive threshold circuit that adjusts for asymmetrical photo diode pulses such that the threshold is set in the "sharp cutoff region" following the falling edge of high amplitude photo diode pulses.

It also would be desirable to provide for a comparator an adaptive threshold circuit that adjusts for distorted photo diode pulses such as those that result when the LED and photo diode touch, such that the threshold voltage is set just below the preamplifier output peak voltage, to accurately reproduce the received pulse width.

SUMMARY OF THE INVENTION

Accordingly, it is an object of this invention to provide for a comparator an improved adaptive threshold circuit that has a first or low threshold voltage for triggering low input signal pulses, and that for higher input signal levels adapts the trigger level such that the photo diode's unique output current characteristics do not undesirably alter the triggering of the comparator It also is an object of this invention to provide for a comparator such an improved adaptive threshold circuit that correctly responds to the first pulse received following a steady state condition.

It is a still further object of this invention to provide for a comparator such an improved adaptive threshold circuit that provides low differential-mode DC offset at the comparator inputs.

It is an additional object of this invention to provide an adaptive threshold circuit that operates over a wide range of input signal frequencies and pulse amplitudes.

It also is an object of this invention to provide for a comparator an adaptive threshold circuit that adjusts for asymmetrical photo diode pulses such that the threshold voltage is set in the "sharp cutoff region" following the falling edge of high amplitude photo diode pulses.

It also is an object of this invention to provide for a comparator an adaptive threshold circuit that adjusts for distorted photo diode pulses such as those that result when the LED and photo diode touch, such that the threshold voltage is set just below the preamplifier output peak voltage, to accurately reproduce the received pulse width.

These and other objects of the invention are provided by a novel adaptive threshold circuit that provides: (1) different threshold voltage levels depending on the input signal amplitude and slope; and (2) an initial threshold voltage at a fixed voltage difference above the input signal bias level.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE INVENTION

Figure 1A:
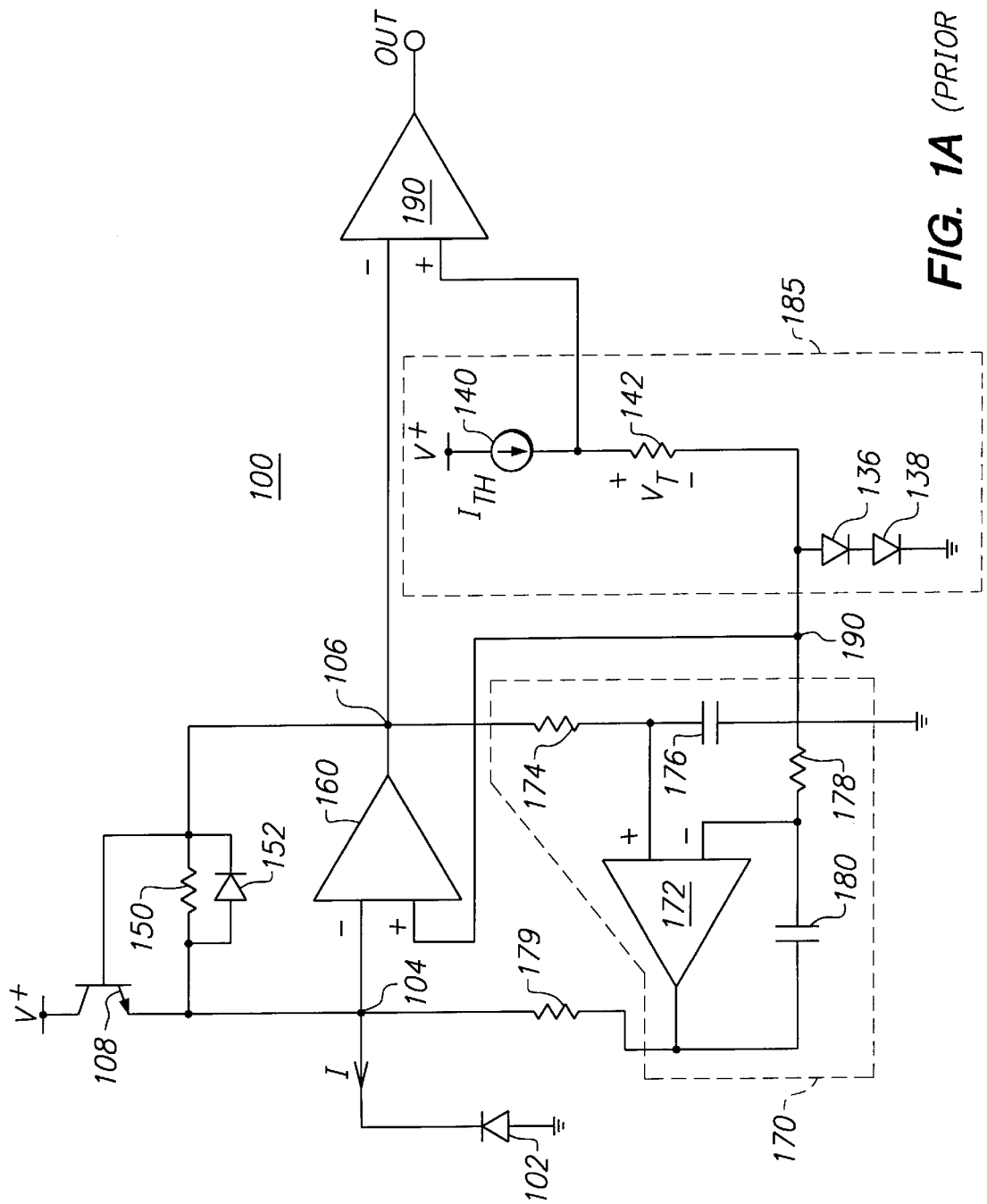
FIG. 1A is a schematic diagram of a conventional DC servo loop amplifier and comparator.

FIG. 1A shows a simplified schematic diagram 100 of a conventional DC servo loop amplifier and comparator 190. In FIG. 1A, preamplifier 160 has a negative input coupled to node 104, a positive input coupled to node 109, and an output coupled to node 106. Photo diode 102 is coupled between ground and node 104, and provides inputs to preamplifier 160 in the form of a current I that varies with the amount of light impinging on the photo diode. In the absence of incident light, photo diode 102 draws no current. As the incident light level increases, photo diode 102 sinks current from node 104. As the light intensity increases, the current I also increases.

Feedback resistor 150 sets the gain of preamplifier 160 and is coupled between node 104 and node 106. Diode 152 and the base-emitter circuit of transistor 108 (the collector of which is coupled to a positive supply rail (V+)) are coupled separately in parallel across resistor 150 and in phase-opposite relationship to one another to clamp or limit the voltage across resistor 150. Diode 152 and transistor 108 set the maximum AC signal level output of preamplifier 160. A DC biasing and threshold-setting network 185 includes current source 140 (that produces current $I_{TH}$), resistor 142, and diodes 136 and 138. The voltage at node 109, which is the sum of the ON-voltages of diodes 136 and 138, provides the DC bias for preamplifier 160.

Transconductance block 170 ("GM block 170") is coupled between nodes 104 and 106, and includes operational amplifier 172, resistors 174 and 178, and capacitors 176 and 180. The positive input of operational amplifier 172 is coupled to node 106 through a low pass filter formed by resistor 174 and capacitor 176. The negative input of operational amplifier 172 is coupled to the output of operational amplifier 172 through a low pass filter formed by resistor 178 and capacitor 180. The negative input of operational amplifier 172 is also coupled to node 109 to set the DC bias of operational amplifier 172. The output of operational amplifier 172 is coupled to node 104 through resistor 179.

GM block 170 functions, in a well-known manner, to control the DC level of the output of preamplifier 160. The values of resistors 174 and 178 are preferably equal, and the values of capacitors 176 and 180 are also preferably equal. This sets poles of equal frequency that lower the gain of GM block 170 as the frequency increases at the positive input of operational amplifier 172. In addition, resistor 179, which converts the output voltage of operational amplifier 172 into an input current at node 104, sets the gain of GM block 170. The gain is equal to the ratio of resistor 150 over resistor 179. If operational amplifier 172 has no input-referred DC offset, GM block 170 forces the DC level at the output of preamplifier 160 to be equal to the DC level at node 109.

The output of preamplifier 160 is coupled to the positive input of operational amplifier 172 and the negative input of comparator 190. The positive input of comparator 190 is coupled to the DC biasing and threshold-setting network 185. Persons skilled in the art will readily recognize that the I-R voltage generated by current $I_{TH}$ across resistor 142 sets the output threshold voltage, $V_T$, of comparator 190. Typically, $I_{TH}$ and resistor 142 are chosen so that the threshold voltage for comparator 190 is set to about one-half of the minimum signal amplitude above the DC bias output of preamplifier 160. Comparator 190 may have built-in hysteresis that internally shifts the threshold voltage downward after the comparator output switches from HIGH to LOW.

The circuit of FIG. 1A, however, is susceptible to DC offset error. The input stage of operational amplifier 172 typically is designed for linear operation over a wide dynamic range. As a result, however, operational amplifier 172 commonly has an offset that is much larger than the offset of preamplifier 160. Persons skilled in the art will readily recognize that any DC offset at the input of operational amplifier 172 also appears at the output of preamplifier 160. If this offset is of the same order of magnitude as the minimum signal level at the output of preamplifier 160, then comparator 190 may never detect low-level photo diode signals.

Figure 1B:
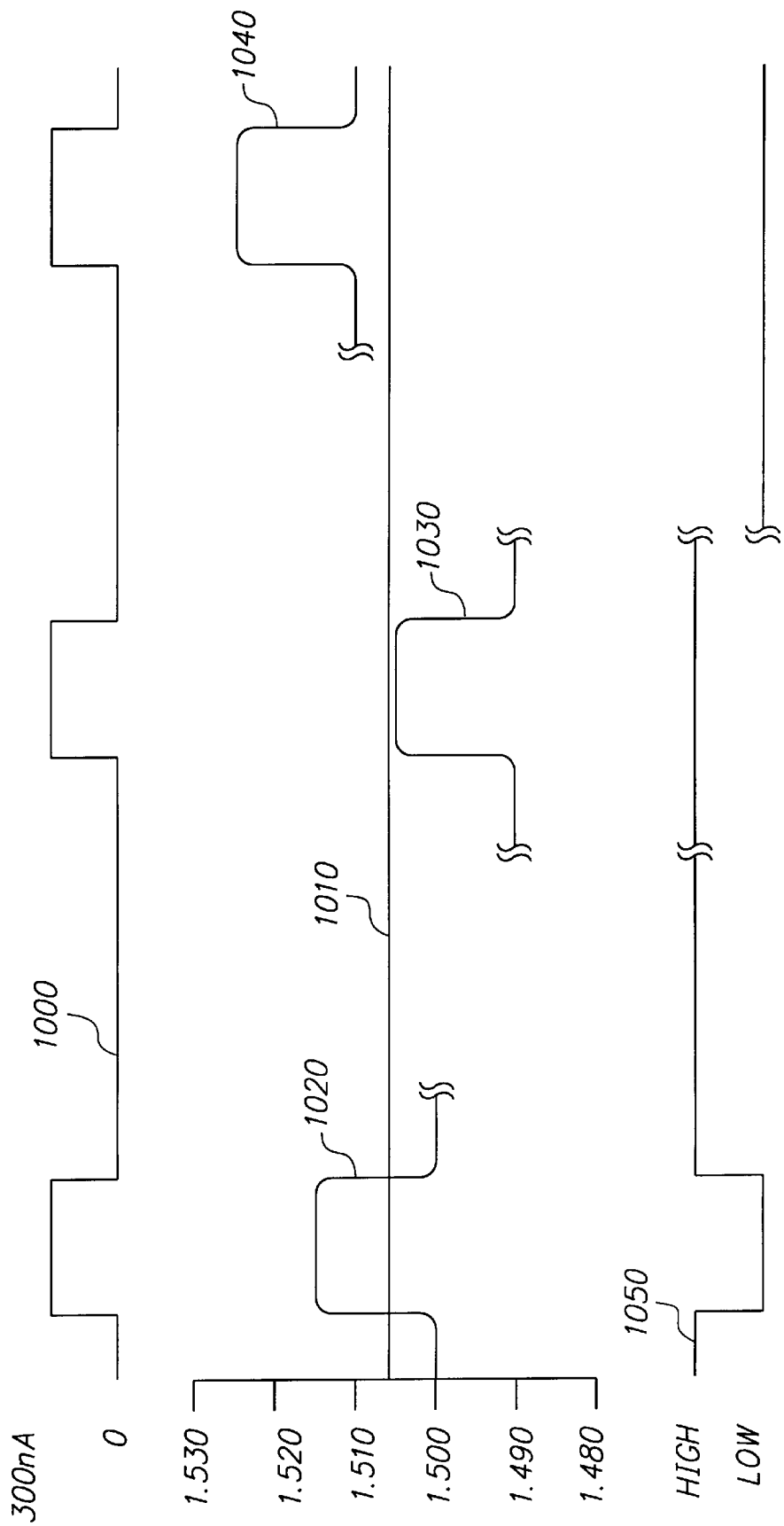
FIG. 1B is a graph showing input current and output voltage of the circuit in FIG. 1A with various levels of preamplifier output DC offset.

This problem is illustrated in FIG. 1B. Trace 1000 shows photo diode current at node 104 (note that current I in FIG. 1A is positive flowing out of node 104). If the peak photo diode current is, for example, 300 nA, and if feedback resistor 150 is of the order of 50 K-ohms, the peak-to-peak output voltage of preamplifier 160 is 15 mV. Trace 1020 shows the output of preamplifier 160 with no DC offset. Trace 1010 shows the threshold voltage coupled to the positive input of comparator 190, and trace 1050 illustrates the output voltage of comparator 190. As FIG. 1B illustrates, with no DC offset at the output of preamplifier 160, comparator 190 accurately reproduces the received light pulse.

DC offset at the output of preamplifier 160 appears as a differential-mode offset at the negative input of comparator 190. Traces 1030 and 1040 show the output of preamplifier 160 with −18 mV and +10 mV DC offsets, respectively. For the signal values shown in FIG. 1B, with −10 mV offset (Trace 1030), the output of preamplifier 160 never crosses the threshold voltage, and comparator 190 never triggers. Similarly, with +10 mV offset (Trace 1040), the output of preamplifier 160 is always greater than the threshold voltage, and comparator 190 never captures the received light pulse. To solve this problem, it has been known to adjust the offset of GM block 170 during manufacture by trimming. However, this increases manufacturing costs and also may not eliminate temperature-dependent offset.

Moreover, there still remains a potential pulse width problem that may arise due to the finite bandwidth of preamplifier 160 at larger signal levels (i.e., signals just below the diode clamp voltage of transistor 108). As the signal level increases from low levels to these larger levels, the different (asymmetrical) positive and negative slew rate characteristics of preamplifier 160 may increase the pulse width produced by comparator 190. Furthermore, the slowly decaying diode "tail," which occurs at a certain percentage of peak diode current, may significantly affect the pulse width at the output of comparator 190 if the threshold voltage is not shifted above the "tail" region into the "sharp cutoff region." These pulse width problems are undesirable, particularly in systems in which timing and window placement of the output pulses are critical.

Figure 2A:
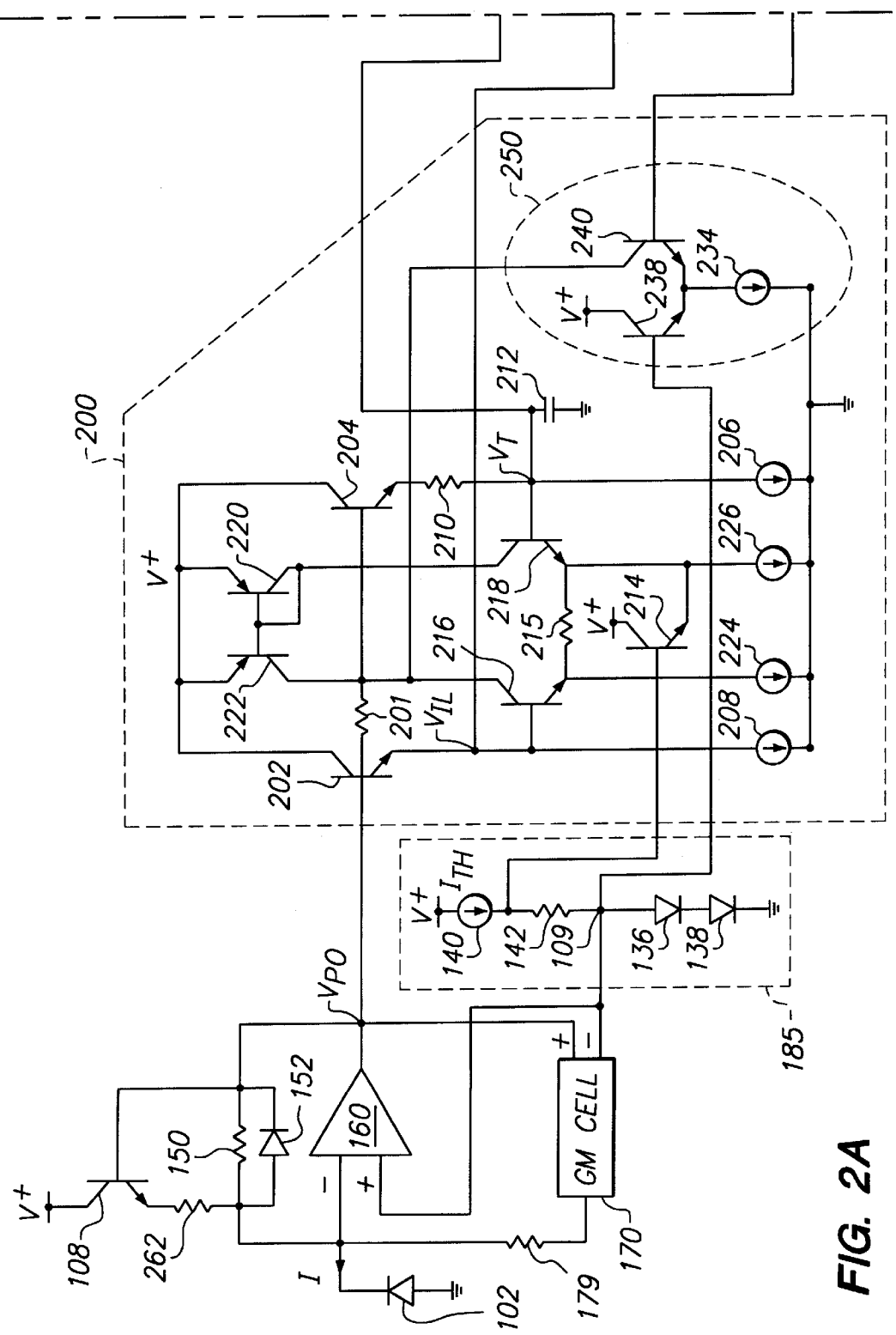
FIG. 2 is a detailed schematic block diagram of the DC servo loop amplifier of FIG. 1A, modified in accordance with the principles of the present invention.

The present invention, as shown in FIG. 2, solves the foregoing and other problems. FIG. 2 shows a detailed schematic block diagram of the circuitry of FIG. 1A modified in accordance with the principles of the present invention. As shown in FIG. 1A, photo diode 102 is coupled between ground and the negative input of preamplifier 160. Feedback resistor 150, clamping diode 152, and the series combination of the base-emitter circuit of transistor 108 are coupled together in parallel between the output, $V_{PO}$, and the negative input of preamplifier 160. As explained in more detail below, resistor 262 is added to the circuitry of FIG. 2 to increase the amplitude of the voltage drop in the sharp cutoff region. The collector of transistor 108 is coupled to the positive supply rail (V+).

Also as shown in FIG. 1A, DC offset at $V_{PO}$ is controlled by GM block 170. As an alternative to using a conventional GM block embodiment as shown in FIG. 1, an exemplary GM block circuit may be used such as that described in Feliz U.S. Pat. No. 5,606,277 (U.S. Pat. No. 5,606,277 and the present application are commonly assigned), the subject matter and disclosure of which are incorporated by reference. The output of GM block 170 is coupled to the negative input of preamplifier 160. The positive input of GM block 170 is coupled to the output of preamplifier 160. The negative input of GM block 170 is coupled to DC bias-setting network 185 including current source 140 (that produces current $I_{TH}$), resistor 142, and diodes 136 and 138. Unlike the circuit shown in FIG. 1A, DC bias-setting network 185 does not generate the threshold signal for comparator 190 shown in FIG. 2. Instead, DC bias-setting network 185 provides DC bias signals only, and circuit 200, described below, generates a threshold signal.

Also shown in FIG. 2 is simplified circuitry of a conventional differential comparator 190. Comparator 190 includes a first stage input differential pair consisting of transistors 270 and 272, coupled through collector resistors 274 and 276 to the positive supply rail (V+), and to ground through a current source generally represented by transistor 278 and voltage reference 280. The differential output of the first stage is inverted by a second stage differential pair consisting of transistors 282 and 284, coupled through collector resistors 288 and 290 to the positive supply rail (V+), and to ground through current source transistor 286. The differential output of transistors 282 and 284 is converted to a single-ended output via the circuitry consisting of transistors 292, 294, 296–299, and resistors 293 and 295. A conventional output stage, consisting of transistors 264–266, and load resistor 267, produces a TTL-level output at OUT.

Adaptive threshold circuit 200, coupled between the output of preamplifier 160 and the DC bias-setting network 185 on the one hand, and the inputs of comparator 190 on the other hand, is constructed and operates in accordance with principles of the present invention. The output of preamplifier 160, $V_{PO}$, is coupled to the base of emitter follower transistor 202 at an input signal node for adaptive threshold circuit 200. The input signal appearing at this node drives the base of emitter follower transistor 202 and the base of emitter follower transistor 204 through resistor 201. Current sources 208 and 206 bias transistors 202 and 204, respectively. A voltage $V_{IL}$ appears at the emitter of transistor 202 as a first output signal of adaptive threshold circuit 200. $V_{IL}$ is a level-shifted version of $V_{PO}$, and is coupled to the negative input of comparator 190. Resistor 210 is coupled between the emitter of transistor 204 and current source 206. Output threshold voltage $V_T$ appears at a node formed between resistor 210 and current source 206 as a second output signal of adaptive threshold circuit 200. $V_T$ is coupled to the positive input of comparator 190. Peak detector capacitor 212 is coupled between the positive input of comparator 190 and ground.

As described in more detail below, network 250, consisting of transistors 238 and 240, and current source 234, provides hysteresis. In addition, as described below, transistors 214, 216, 218, 220 and 222, resistor 215, and current sources 224 and 226 control the output threshold voltage $V_T$ based on the amplitude of $V_{PO}$.

In accordance with the principles of the present invention, output threshold voltage $V_T$ adapts to characteristics of $V_{IL}$, which is a level-shifted version of the output of preamplifier 160. Adaptive threshold circuit 200 generates an output threshold voltage $V_T$ having a DC component that is a fixed voltage above the DC component of $V_{IL}$, and having an AC component that adapts to the AC component of $V_{IL}$. The operation of adaptive threshold circuit 200 is described under the following operating conditions: (1) DC and "low level" input signals; (2) "medium level" input signals; and (3) "high level" input signals.

A bias signal from DC bias-setting network 185 is coupled to the base of transistor 214, which serves as a first bias signal node for adaptive threshold circuit 200. For DC and "low level" input signals, $V_{IL}$ and $V_T$ are below the base voltage of transistor 214, which is set by the voltage drop across resistor 142 and the two voltage drops developed by diodes 136 and 138 to a voltage that is below the clamp voltage of preamplifier 160 as determined by transistor 108 and resistor 262. Because $V_{IL}$ and $V_T$ are below the base voltage of transistor 214, transistors 216, 218, 220 and 222 are OFF, and current sources 224 and 226 sink current from V+ through transistor 214 and resistor 215. The voltage level at the base of transistor 214 is set to a level such that any DC offsets produced by GM block 170 are insufficient to turn ON transistors 216 and 218. As described in more detail below, in steady state, transistor 240 is normally OFF. As a result, the voltage drop across base resistor 201 is negligible. In steady-state, the value of the output threshold voltage $V_T$ is determined by the difference between the quiescent base-emitter voltages $V_{BE}$ of transistors 202 and 204, minus the voltage drop across resistor 210. For DC and "low level" input signals, output threshold voltage $V_T$ is set to approximately one-half of the minimum expected peak AC amplitude of $V_{IL}$.

The base-emitter voltages $V_{BE}$ of transistors 202 and 204 are determined by each transistor's base-emitter junction area and their corresponding collector currents, which are approximately equal to the value of current sources 208 and 206. In the exemplary embodiment of FIG. 2, the ratio of base-emitter junction areas of transistors 202 and 204 is 3:5, and the collector currents of transistors 202 and 204 are substantially equal. In alternative embodiments, the base-emitter junction area of transistors 202 and 204 can be equal in size (ratio of 1:1) and the transistors' collector currents can be ratioed by ratioing the value of current sources 206 and 208 to create a differential between the DC base-emitter voltages of transistors 202 and 204. By proportioning the base-emitter junction areas of transistors 202 and 204, or the value of current sources 206 and 208, the adaptive threshold circuit 200 establishes a first predetermined relationship between $V_{IL}$ and $V_T$. In particular, the DC component of $V_T$ may be set to an approximately a fixed voltage above the DC bias level of $V_{IL}$. For example, (1) by setting the ratio of the base-emitter junction areas of transistors 202 and 204 to 3:5, and by using substantially equal current sources 206 and 208, or (2) by setting the ratio of the base-emitter junction areas of transistors 202 and 204 to 1:1, and by setting the ratio of current sources 206 and 208 to 5:3, the DC component of $V_T$ is approximately 6.5 mV above the DC bias level of $V_{IL}$.

Figure 3:
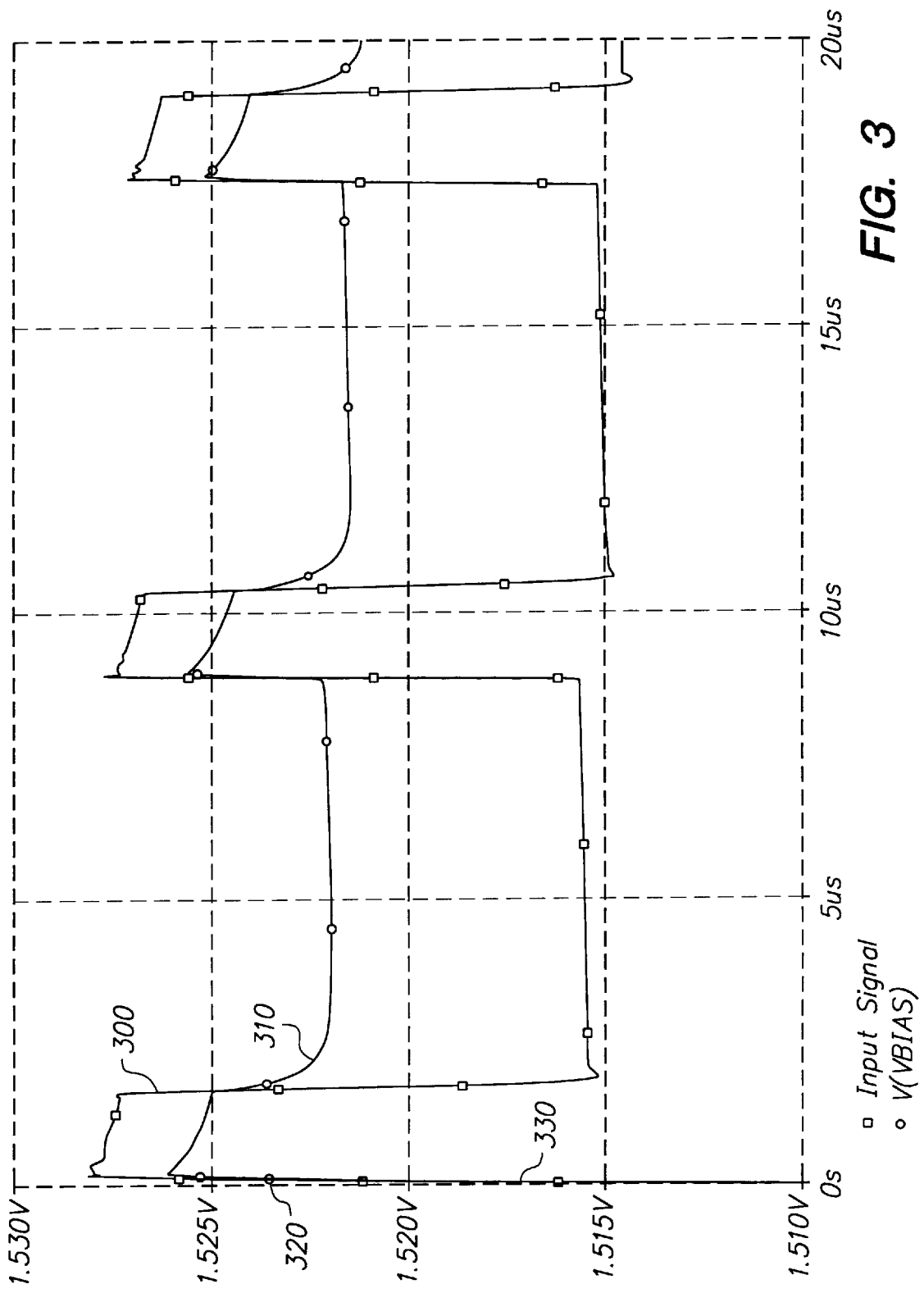
FIG. 3 is a graph showing voltage versus time characteristics of the inputs to the comparator of the circuitry of FIG. 2 for "low level" input signals.

FIG. 3 shows the response of the above-described adaptive threshold circuit to "low level" input signal pulses. Trace 300 shows the voltage characteristic versus time for input signal $V_{IL}$, and trace 310 shows the corresponding characteristic for output threshold voltage $V_T$. As shown in FIG. 3, for "low level" input signals, $V_{IL}$ has a DC bias level of approximately 1.515 V, and $V_T$ adapts to $V_{IL}$. The output threshold voltage $V_T$ is initially set to an approximately fixed voltage above the DC level of $V_{IL}$. In particular, the DC component of $V_T$ is approximately 6.5 mV above the DC bias level of $V_{IL}$.

While $V_{IL}$ is below $V_T$, the base of transistor 297 of comparator 190 is LOW, causing the output of comparator 190 to be HIGH and the base of transistor 240 to be lower than the base of transistor 238. Transistor 238 therefore carries the full current drawn by current source 234, and transistor 240 is OFF.

As shown in FIG. 3, when a photo diode pulse is received, for example as shown by reference numeral 330, $V_{IL}$ begins to rise. As $V_{IL}$ rises, $V_T$ also rises, but not as fast due to the time constant of resistor 210 and capacitor 212. Because the output of preamplifier 160 has a fixed bandwidth, $V_{IL}$ will have some minimum rise time, allowing $V_T$ to rise just a bit before $V_{IL}$ rises above $V_T$. The point at which $V_{IL}$ crosses $V_T$ is about 7.5 mV, as indicated in FIG. 3 by reference 320. At that point, therefore, the AC component of the output threshold voltage $V_T$ is approximately 1 mV. The circuit therefore captures the first photo diode pulse received from the preamplifier (provided, of course, that the pulse exceeds the minimum DC threshold).

The hysteresis network 250 formed by transistors 238 and 240, and current source 234 operates as follows. The base of transistor 238 is biased by the voltage developed at node 109. The magnitude of the collector current of transistor 238 is determined by current source 234 and is controlled by the switching action of comparator 190 through transistor 240. Shortly after $V_{IL}$ rises above $V_T$, the output of comparator 190 switches from HIGH to LOW, and the base voltages of transistors 297 and 240 are pulled HIGH. Transistor 238 therefore turns OFF, and transistor 240 begins to draw current through resistor 201, reducing the voltage at the base of transistor 204. Through selection of proper component values, the voltage drop across resistor 201 prevents $V_T$ from following $V_{IL}$. As shown in FIG. 3, when the photo diode pulse is HIGH, $V_T$ is approximately 2 mV below $V_{IL}$. The hysteresis network thereby adds sufficient noise margin to avoid false triggering of comparator 190 before the pulse ends.

Figure 4:
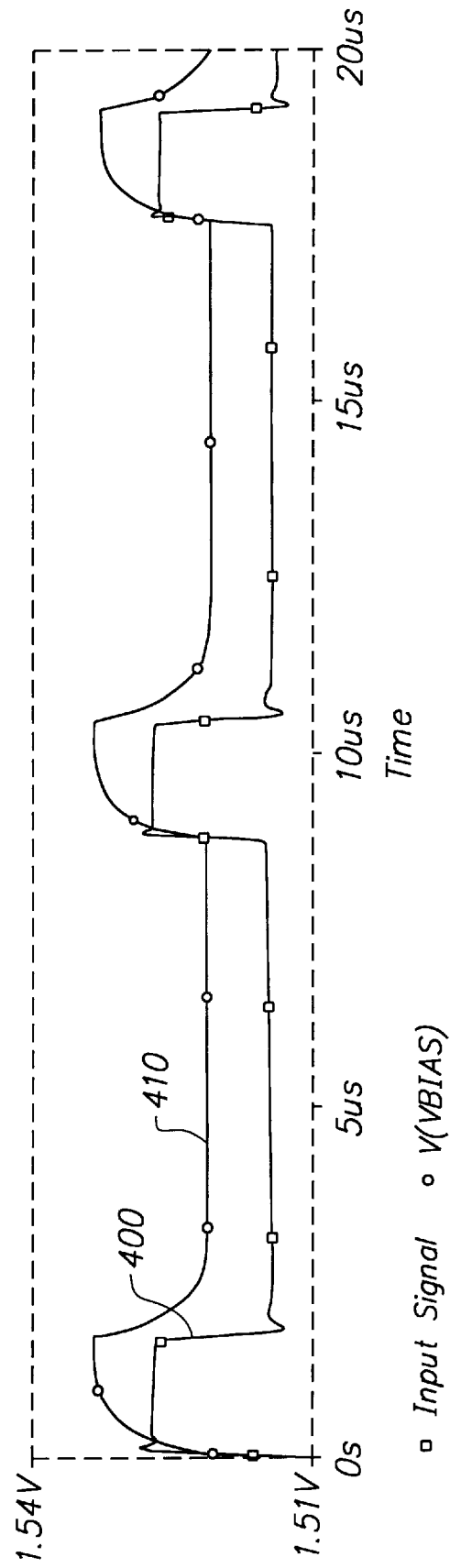
FIG. 4 is a graph showing voltage versus time characteristics of the inputs to a comparator for an alternative exemplary embodiment of the invention that may be used with comparators having internal hysteresis.

Alternatively, in another embodiment of the present invention, comparator 190 could be modified to include a built-in hysteresis effect so that transistors 238 and 240, and current source 234 in hysteresis network 250 could be removed from adaptive threshold circuit 200. FIG. 4 shows the response of the adaptive threshold circuit of this alternative embodiment to low level input signal pulses. Trace 400 shows the low level input signal $V_{IL}$ and trace 410 shows the $V_T$ signal. Note that $V_T$ rises above $V_{IL}$ at the top of the pulses. This does not pose a problem when a comparator is used that has hysteresis built-in of the same magnitude as the "low-level" threshold voltage offset. This is because the comparator will internally shift the received output threshold voltage $V_T$ down below $V_{IL}$.

Preferred embodiments of the present invention are typically implemented as integrated circuity. Thus, the hysteresis function may be more conveniently implemented as part of adaptive threshold circuit 200 than as a separate circuit within comparator 190. Note that in either embodiment, for "low lever" input signals, $V_{IL}$ always returns to its initial voltage level of about 1.5 volts, and $V_T$ returns to the initial DC threshold voltage above $V_{IL}$ (see FIGS. 3 and 4).

As the input signal level increases beyond the "low" signal level to "medium" signal levels, the voltage at the base of transistor 216 rises above the voltage at the base of transistor 214. When this happens, transistor 214 begins to turn OFF, and transistor 216 begins to turn ON. Because the voltage at the base of transistor 216 is higher than the voltage at the base of transistor 218, the current from current sources 224 and 226 is shared primarily by transistors 214 and 216. Transistors 218, 220 and 222 conduct negligible current, and therefore do not affect the output threshold voltage $V_T$. The collector of transistor 216 conducts a first compensating current that causes a voltage drop across resistor 201, pulling down on $V_T$, and keeping that voltage from increasing above $V_{IL}$. In this way, adaptive threshold circuit 200 establishes a second predetermined relationship between $V_{IL}$ and $V_T$. In particular, $V_T$ is caused to be at a level that is a predetermined amount less than the level of $V_{IL}$ when the photo diode pulse is HIGH. As a result of the current sharing by transistors 214 and 216, which depends on the input signal amplitude, the voltage difference between $V_{IL}$ and $V_T$ varies with the input signal amplitude. For example, if $V_{IL}$ is approximately 1.9 V when the photo diode pulse is HIGH, and if current sources 224 and 226 are set to 50 µA, and resistor 201 set to 3 KΩ, $V_T$ can be set to approximately 100 mV below the amplitude of $V_{IL}$ when the photo diode pulse is HIGH. The voltage difference between $V_{IL}$ and $V_T$ varies in an approximately linear manner with the input signal. The linearity is largely due to the presence of resistor 215. The transition between the circuit operation for "low" input signals and higher signal levels may be adjusted by appropriate selection of current $I_{TH}$ and resistor 142.

Figure 5:
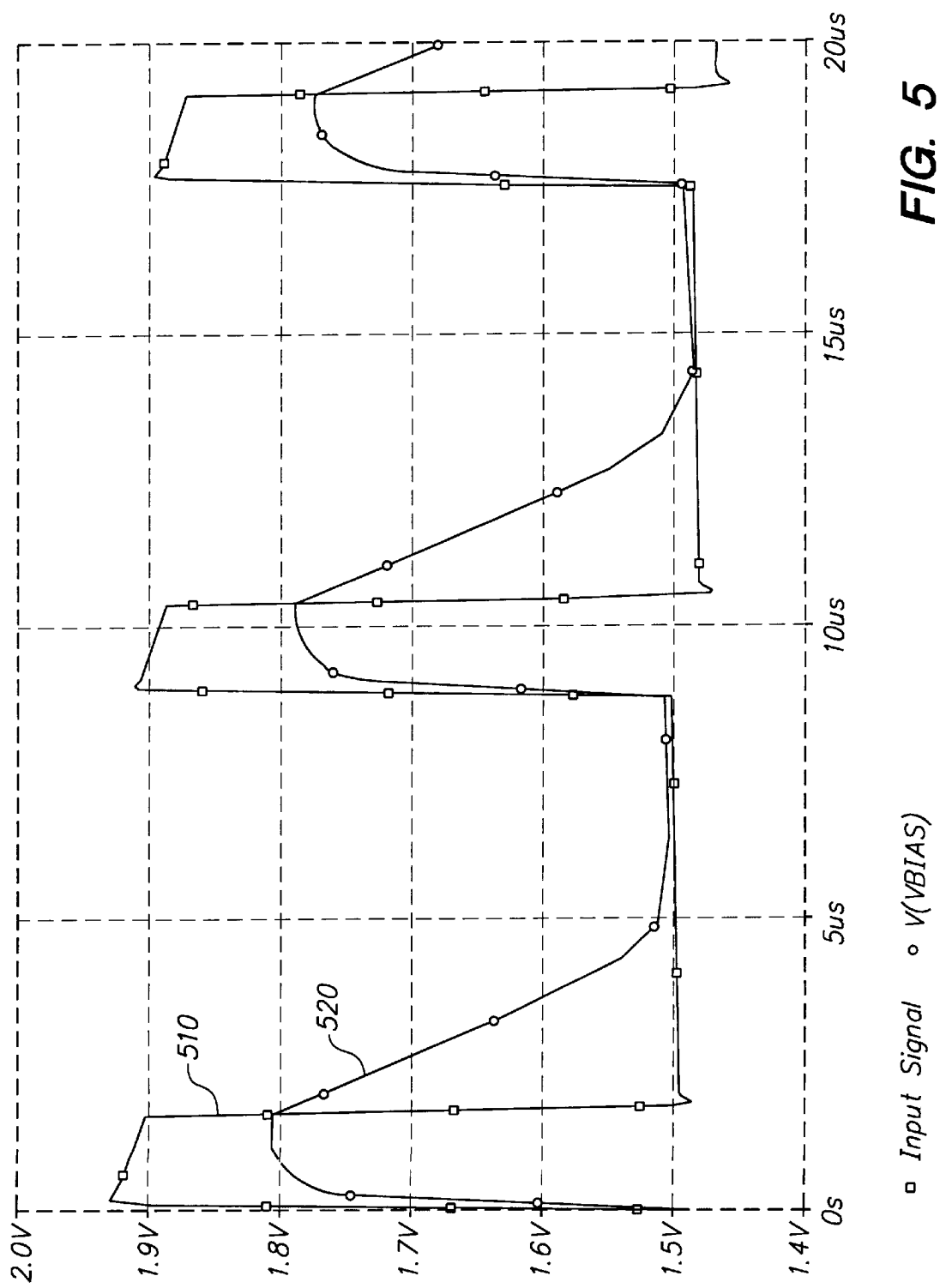
FIG. 5 is a graph showing voltage versus time characteristics of the inputs to the comparator of FIG. 2 for "medium level" input signals.

FIG. 5 illustrates the circuit operation for "medium" signal levels. As shown in FIG. 5, as $V_{IL}$ (trace 510) increases in amplitude, $V_T$ (trace 520) follows $V_{IL}$, minus the voltage drop across resistor 201 caused when transistor 216 starts to turn ON. The voltage drop across resistor 201 is approximately equal to the magnitude of the collector currents of transistors 216 and 240 multiplied by the value of resistor 201. In the exemplary embodiment of FIG. 2, $V_T$ is approximately 100 mV below the amplitude of $V_{IL}$ when the photo diode pulse is HIGH (as shown in FIG. 5). Note also that the slope of $V_{IL}$ is positive as it increases from LOW to HIGH, but becomes negative while $V_{IL}$ is HIGH. This is due to the servo action of GM block 170. If transistor 216 were not present in the circuit to pull down on $V_T$ during this period of negative slope, $V_{IL}$ could cross the $V_T$ level stored on capacitor 212—resulting in an undesirable change of state of the output of comparator 190.

Figure 6:
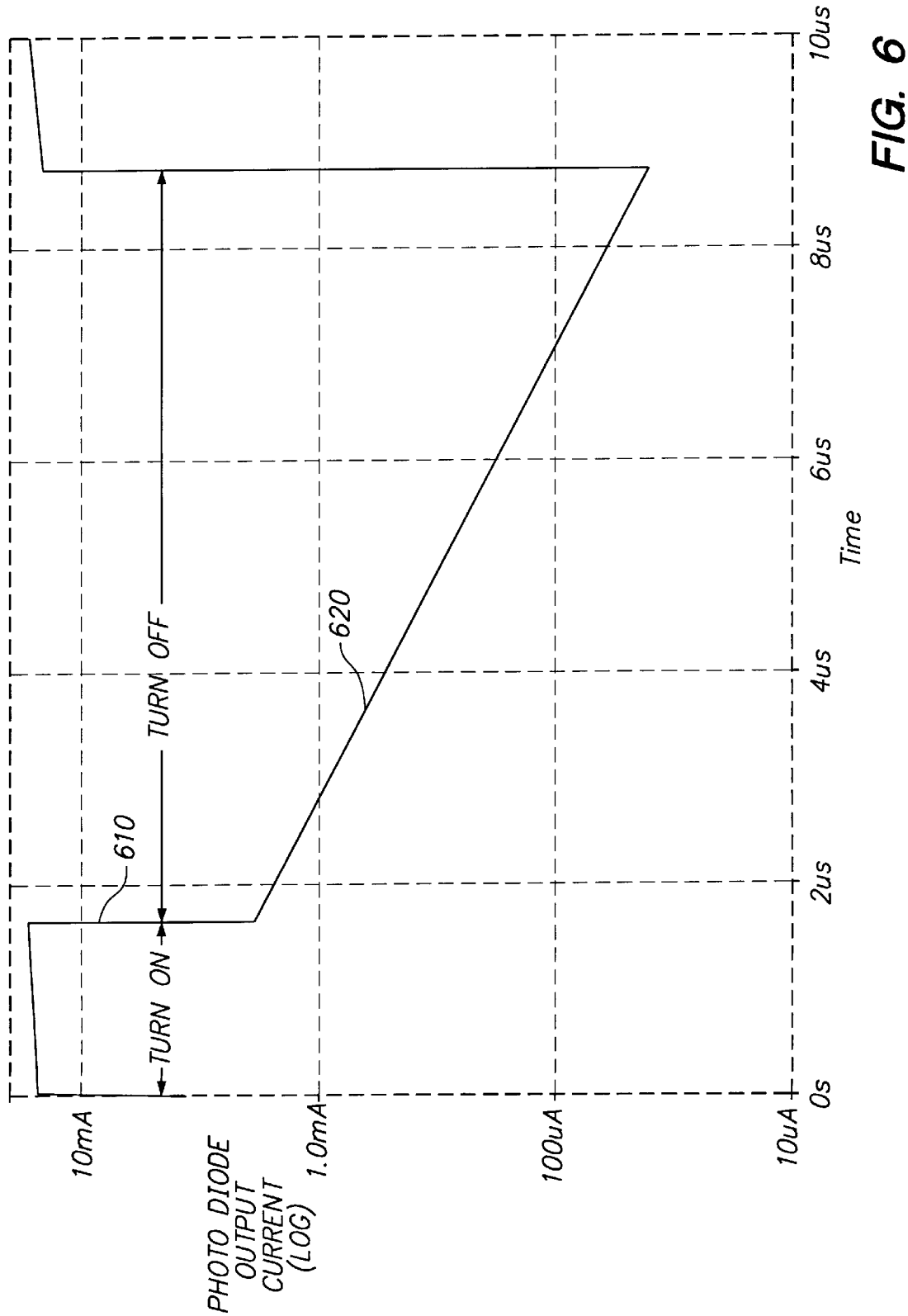
FIG. 6 is a graph showing log current versus time response characteristic of a typical photo diode for "high level" input signals.

As the input signal increases from "medium" to "high" signal amplitudes, a problem can occur due to the nature of the response characteristic of photo diode 102. At "high" signal levels, photo diodes tend to exhibit a "tail" after the received light pulse has ended. That response characteristic is illustrated in FIG. 6, which shows a log current versus time characteristic for a typical photo diode. As shown in FIG. 6, when photo diode 102 turns ON in the presence of bright light, its output current rises to a maximum level. When the light turns OFF, however, the diode continues to conduct current due to a diffusion time constant. At about 1.5 µsec, the light is turns OFF and the photo diode current drops rapidly from over 10 mA to about 2 mA. This "sharp cutoff region" is indicated in FIG. 6 at 610. After the photo diode current drops below approximately 2 mA, however, the current decay slows significantly to about 40 µA at about 8.7 µsec. This "tail region" is indicated in FIG. 6 at 620.

If the photo diode current in the tail region is about 40 µA, and if feedback resistor 150 is of the order of 50 K-ohms, the output of preamplifier 160 is clamped by transistor 108, and $V_{IL}$ drops in the tail region to only tens of millivolts below its peak value. To accurately reproduce the received light pulse at the output of comparator 190, the output threshold voltage $V_T$ should be set to a voltage tens of millivolts below the peak output of preamplifier 160 in the sharp cutoff region before the start of the tail region. Accurately controlling $V_T$ in such a narrow voltage range is difficult. Resistor 262, however, solves this problem in accordance with principles of the present invention by increasing the linear operating range of preamplifier 160, thereby permitting $V_{IL}$ to drop substantially in the sharp cutoff region following a "high" level light pulse.

Figure 7:
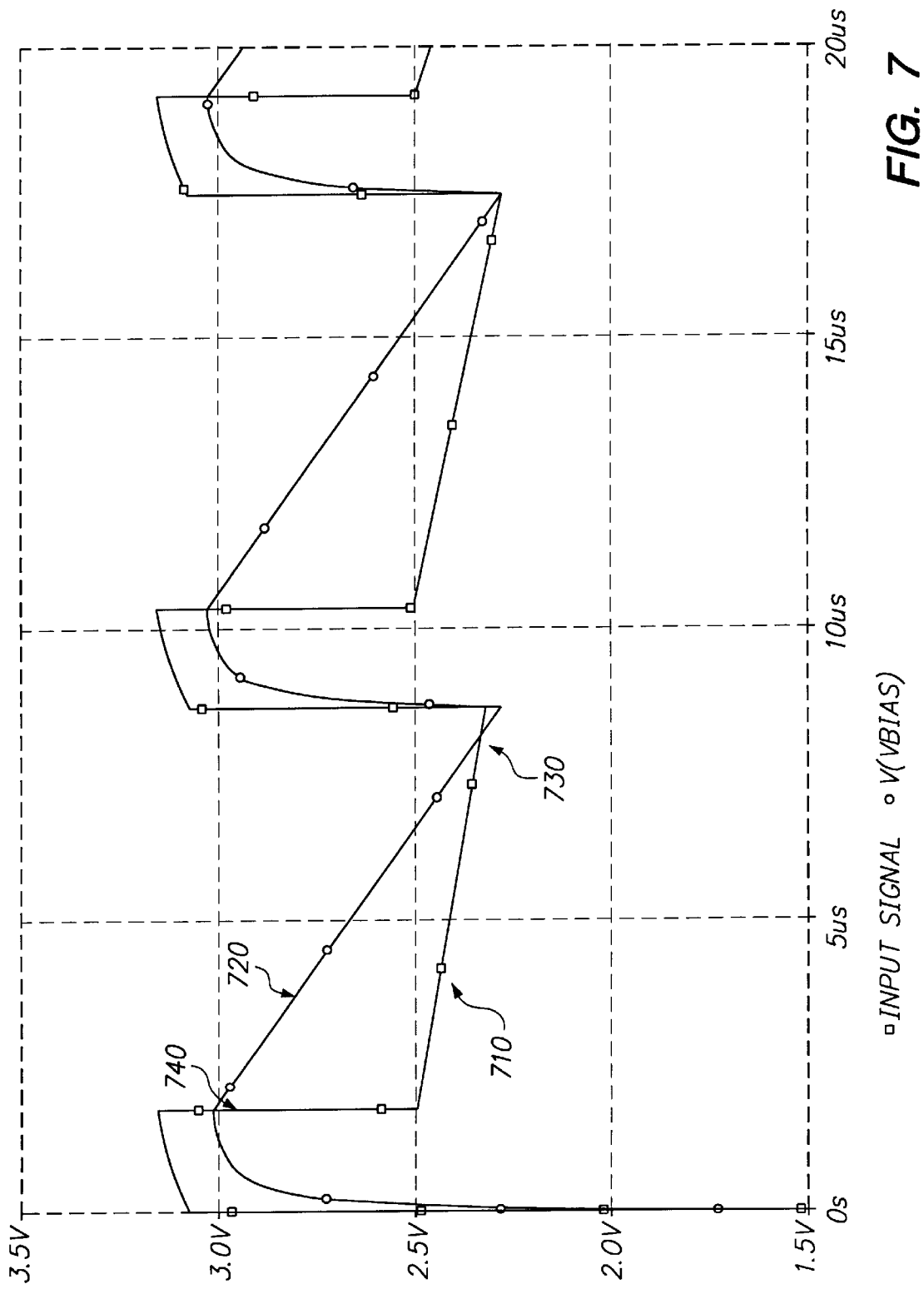
FIG. 7 is a graph showing voltage versus time characteristics of the inputs to the comparator of FIG. 2 for "high level" input signals with the "tail" characteristics of a photo diode, that may result if portions of the invented circuitry of FIG. 2 are omitted.

The asymmetrical discharge tail of the photo diode's turn-off response characteristic can cause another problem of premature switching of the comparator. This problem is illustrated in FIG. 7. Trace 710 shows $V_{IL}$ and trace 720 shows the output threshold voltage $V_T$. As shown in FIG. 7, $V_T$ could discharge below the "tail" region of $V_{IL}$ (see the intersection of traces 710 and 720 at reference number 730). If this occurs, comparator 190 triggers prematurely (even though the light has been removed from the photo diode) because $V_T$ has dropped below $V_{IL}$ (the LOW state for $V_{IL}$ being now about 2.4 volts, rather than 1.5 volts).

Transistors 220 and 222, in accordance with the principles of the present invention, solve this potential problem. At "high" signal levels, transistor 214 is OFF because $V_T$ is higher than the voltage at the base of transistor 214. Beginning in the sharp cutoff region after $V_{IL}$ drops below $V_T$ (shown at reference numeral 740), the base voltage of transistor 218 is greater than the base voltage of transistor 216, and therefore transistor 218 is ON and transistor 216 is OFF. (Note that as $V_{IL}$ drops below $V_T$ in the sharp cutoff region there is a gradual transition in which transistor 216 begins to turn OFF and transistor 218 begins to turn ON). Emitter resistor 215 increases the linear operating range of transistor 218, which conducts a substantial portion of the current drawn by current sources 224 and 226. Transistor 218 conducts a second compensating current that, by the action of PNP current mirror transistors 220 and 222, flows into a node formed between resistor 201 and the base of transistor 204. The current that flows through resistor 201 is primarily the collector current in transistor 218 that is mirrored by transistor 222. As a result, the voltage at the base of transistor 204 increases, thereby increasing the minimum signal level to which $V_T$ can decay, and maintaining $V_T$ above $V_{IL}$. In this manner, adaptive threshold circuit 200 establishes a third predetermined relationship between $V_{IL}$ and $V_T$.

Figure 8:
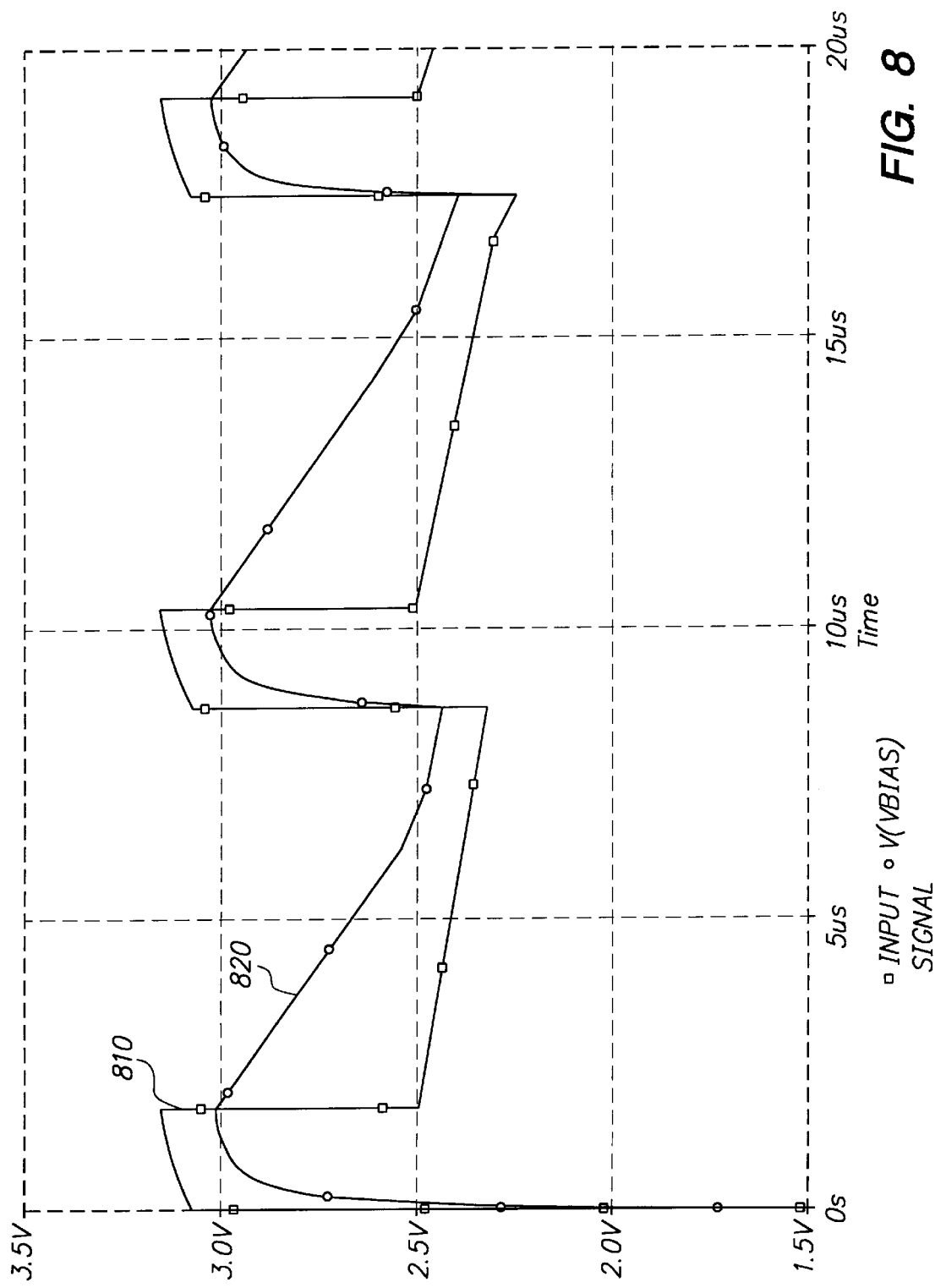
FIG. 8 is a graph showing voltage versus time characteristics of the inputs to the comparator of FIG. 2 for "high level" input signals with the "tail" characteristics produced by a photo diode that receives a "high level" light pulse.

The result of this operation is shown in FIG. 8. Trace 810 shows $V_{IL}$ and trace 820 shows the output threshold voltage $V_T$. Note in FIG. 8 that at all times after $V_{IL}$ has dropped below $V_T$, $V_T$ remains above $V_{IL}$. Thus, comparator 190 does not prematurely trigger at "high" signal levels. Raising the voltage at the base of transistor 204 has the added benefit of increasing noise immunity by assuring that $V_T$ remains above $V_{IL}$. This additional voltage is primarily determined by the current drawn through resistor 201 by the PNP current mirror.

Should a sufficient time elapse after the last "high level" photo diode pulse, the tail of the photo diode decays down to its DC level. The output threshold voltage $V_T$ follows the $V_{IL}$ tail down until it falls below the voltage level at the base of transistor 214. At this point, transistors 216 and 218 turn OFF and transistor 214 supplies the current for current sources 224 and 226. Capacitor 212 then discharges, dropping the output threshold voltage $V_T$ to the low DC threshold voltage.

In the embodiment shown in FIG. 2, the adaptive threshold circuit 200 establishes three predetermined relationships between $V_{IL}$ and $V_T$. Persons skilled in the art will appreciate that additional or other predetermined relationships may be added without departing from the scope of the present invention. This may be accomplished, for example, by adding circuitry to further control the voltage dropped across resistor 201, in response to either $V_{IL}$ or $V_T$, or both. In the embodiment shown in FIG. 2, all currents used to adjust the comparator threshold voltage are matched for better tracking.

Figure 9:
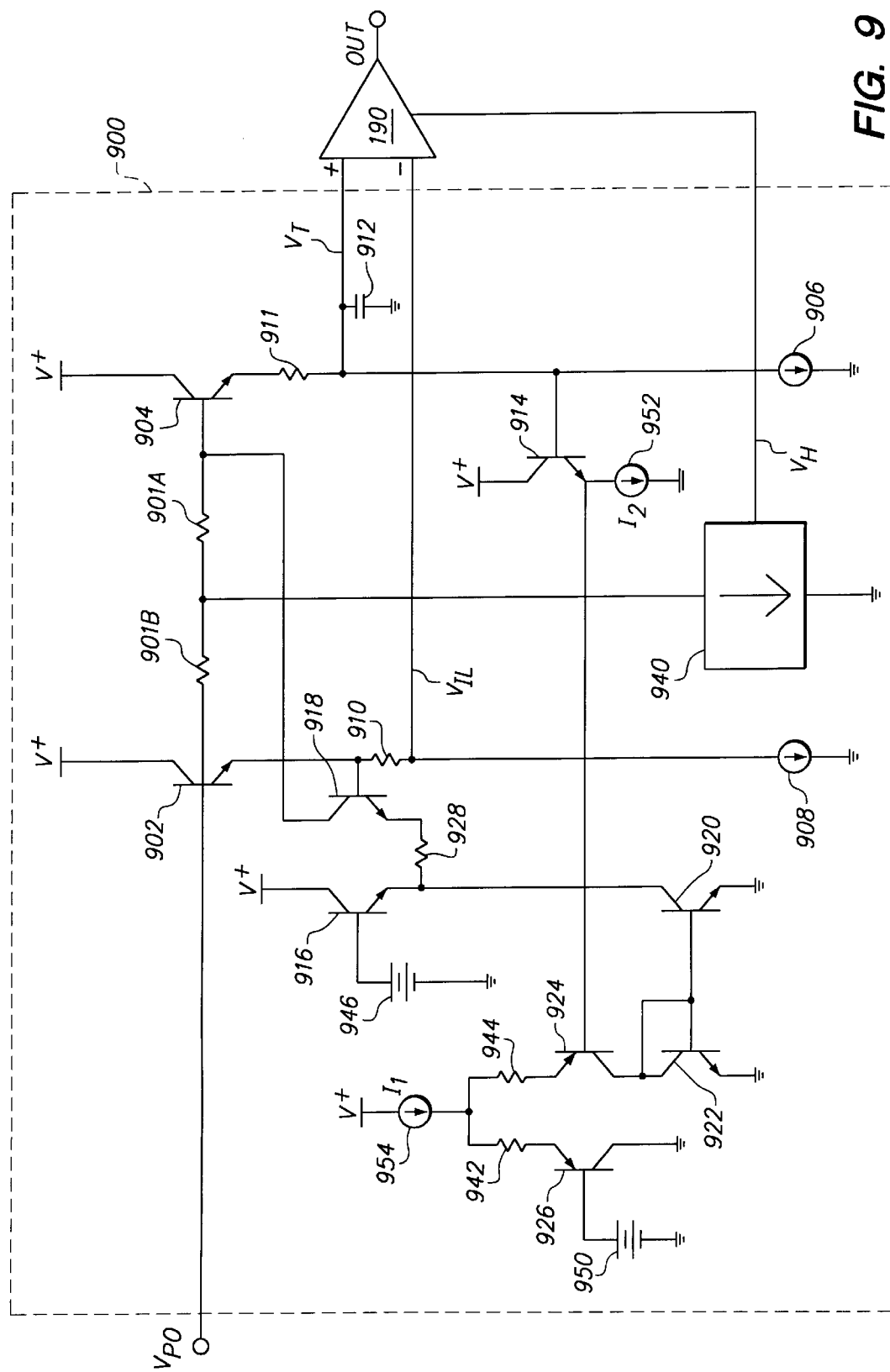
FIG. 9 is a schematic diagram of an alternative embodiment of an adaptive threshold trigger circuit constructed in accordance with the principles of the present invention.

An alternative embodiment of the adaptive threshold-setting network of the present invention is shown in FIG. 9. Adaptive threshold circuit 900, coupled between the output of preamplifier 160, $V_{PO}$, and the inputs of comparator 190 is constructed and operates in accordance with principles of the present invention. A DC bias-setting network generates voltage references 946 and 950 (as illustrated by the "battery" symbols shown in FIG. 9). Voltage reference 946 provides a first bias signal that is coupled to the base of transistor 916, which serves as a first bias signal node for adaptive threshold circuit 900. Voltage reference 950 provides a second bias signal that is coupled to the base of transistor 926, which serves as a second bias signal node for adaptive threshold circuit 900.

The preamplifier output $V_{PO}$ is coupled to the base of emitter follower transistor 902, at an input signal node for adaptive threshold circuit 900. The input signal appearing at this node drives the base of emitter follower transistor 902 and the base of emitter follower transistor 904 through series-connected resistors 901A and 901B. Resistor 901B is much smaller than resistor 901A. Transistors 902 and 904 are biased by matched current sources 908 and 906. Resistor 910 is coupled between the emitter of transistor 902 and current source 908. $V_{IL}$ appears at a node formed between resistor 910 and current source 908 as a first output signal of adaptive threshold circuit 900. $V_{IL}$ is coupled to the negative input of comparator 190. Because emitter follower transistor 902 has approximately unity small signal gain, $V_{IL}$ is approximately equal to $V_{PO}$, minus the $V_{BE}$ drop of transistor 902 and the voltage drop across resistor 910. Emitter resistor 911 is coupled between the emitter of transistor 904 and current source 906. The positive input of comparator 190 is coupled to a node formed at the junction of resistor 911, the top plate of peak detector capacitor 912, and current source 906. Resistor 911 provides current limiting for transistor 904 and limits the time rise time of capacitor 912.

As described in more detail below, transistors 914, 916, 918, 920, 922, 924 and 926, resistors 928, 942 and 944, current sources 952 and 954, and voltage references 946 and 950 are used to control the output threshold voltage $V_T$, which is a second output signal of adaptive threshold circuit 900, based on the amplitude of $V_{PO}$. In addition, as described below, network 940 provides hysteresis.

In accordance with the principles of the present invention, adaptive threshold circuit 900 generates an output threshold voltage $V_T$ that adapts to the characteristics of the preamplifier's output voltage. As in the embodiment of FIG. 2, adaptive threshold circuit 900 generates an output threshold voltage $V_T$ whose DC component is approximately a fixed voltage above the DC component of $V_{IL}$, and whose AC component adapts to the AC component of $V_{IL}$. The operation of adaptive threshold circuit 900 is described under the following operating conditions: (1) DC and "low level" input signals; (2) "medium level" input signals; and (3) "high level" input signals.

For DC and "low level" input signals, output threshold voltage $V_T$ is set to approximately one-half of the minimum peak amplitude of $V_{IL}$. The base-emitter junction area of transistors 902 and 904 are equal in size, and the transistor collector currents are substantially equal. Thus, the base-emitter voltages $V_{BE}$ of transistors 902 and 904 are closely matched, and track well over temperature. Voltage reference 946 determines the "low" input signal level, and is coupled to the base of transistor 916. This voltage is set to a level such that for DC and "low level" input signals, including any DC offsets in the preamplifier's output, transistor 918 remains OFF and draws no current from resistors 901A and 901B.

Network 940, whose internal circuit components are not shown, provides hysteresis, in a manner similar to network 250 in the embodiment shown in FIG. 2. For example, when $V_{IL}$ is below output threshold voltage $V_T$, and the output of comparator 190 is HIGH, $V_H$ is LOW, and network 940 draws no current. Thus, there is negligible voltage drop across resistors 901A and 901B. Resistor 910 is much larger than resistor 911, so the voltage drop across resistor 911 is negligible compared to the voltage drop across resistor 910. Thus, for DC and "low level" signals, the output threshold voltage $V_T$ is fixed above $V_{IL}$ by an amount approximately equal to the voltage drop across resistor 910. By proportioning the resistance values of resistors 910 and 911, the adaptive threshold circuit 900 establishes a first predetermined relationship between $V_{IL}$ and $V_T$. For example, by setting current sources 906 and 908 to 10 μA, and resistors 910 and 911 to 500 Ω and 25 Ω, respectively, the DC component of $V_T$ is approximately 4 mV above the DC bias level of $V_{IL}$. As in the embodiment of FIG. 2, for DC and "low-level" signals, $V_T$ is set to approximately one-half of the minimum peak AC amplitude of $V_{IL}$.

Figure 10:
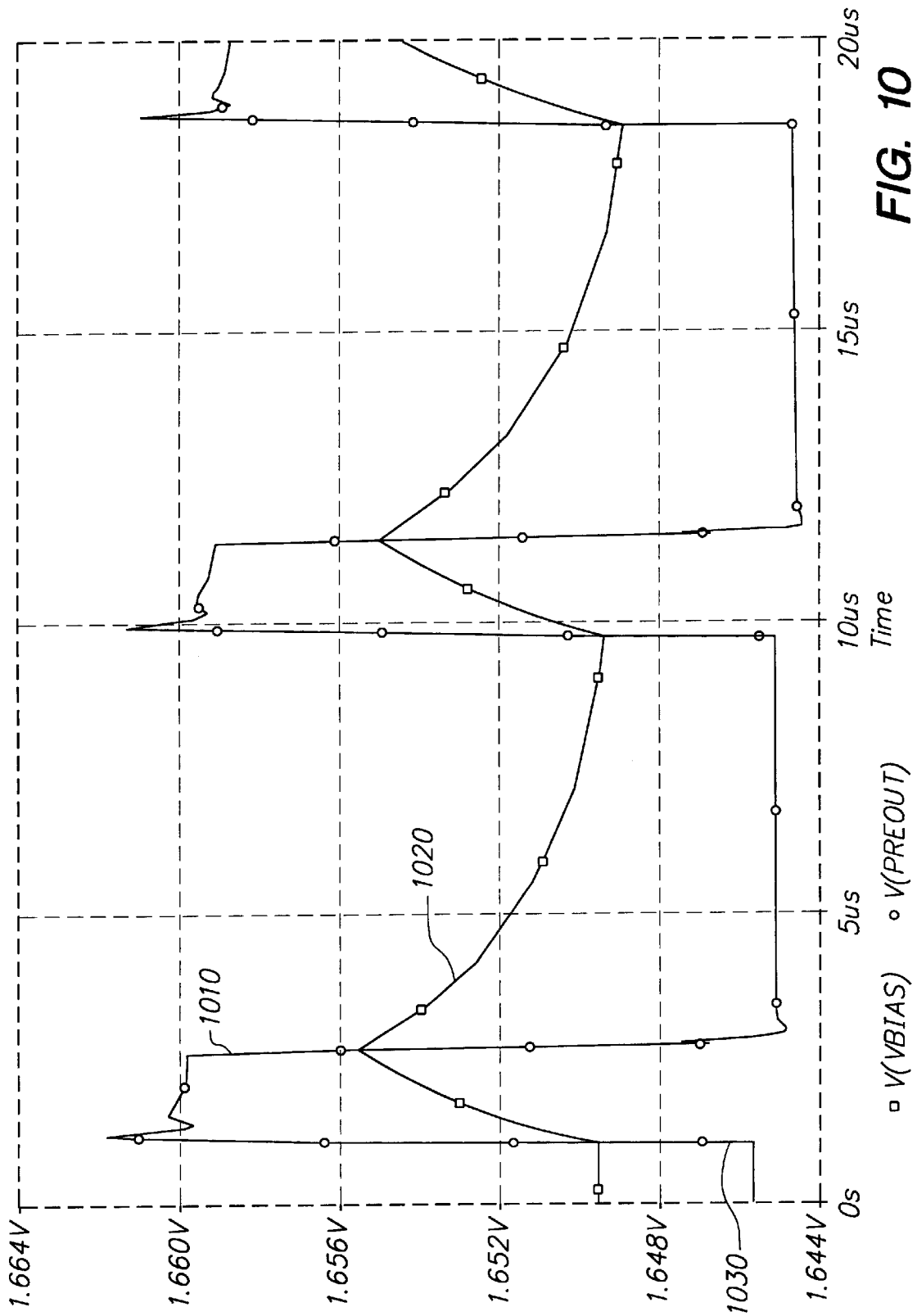
FIG. 10 is a graph showing voltage versus time characteristics of the inputs to the comparator of the circuitry of FIG. 9 for "low level" input signals.

FIG. 10 shows the response of the adaptive threshold circuit shown in FIG. 9 to "low level" signal pulses. Trace 1010 shows $V_{IL}$, and trace 1020 shows output threshold voltage $V_T$. As shown in FIG. 10, $V_{IL}$ has a DC bias level of approximately 1.646 V, and $V_T$ adapts to $V_{IL}$.

For DC and "low level" input signals, transistors 918 is OFF. The output threshold voltage $V_T$ is initially set to an approximately fixed threshold above the DC level of $V_{IL}$. In particular, the DC component of $V_T$ is approximately 4 mV above the DC bias level of $V_{IL}$. While $V_{IL}$ is below $V_T$, the output OUT of comparator 190 is HIGH, and hysteresis network 940 draws no current from resistor 901B.

As shown in FIG. 10 at reference numeral 1030, when the photo diode pulse is HIGH, $V_{IL}$ begins to rise. As the input signal rises, $V_T$ also rises, but not as fast due to the time constant of resistor 911 and capacitor 912. Shortly after the input signal $V_{IL}$ crosses output threshold voltage $V_T$, the comparator output switches from HIGH to LOW, and $V_H$ goes HIGH. Hysteresis network 940 begins to draw current from resistor 901B, thereby lowering the base voltage of transistor 904. Through proper selection of component values, the voltage drop across resistor 901B prevents $V_T$ from following $V_{IL}$, thereby adding sufficient noise margin to avoid false triggering of comparator 190 before the pulse ends.

Voltage reference 946 is set to a level such that for DC and "low level" input signals, transistor 918 is OFF, and transistor 916 is ON, supplying the current for current source transistor 920 from V+. The collector current of transistor 920 is set by diode-connected transistor 922, and the network consisting of transistors 924, 926 and 914, resistors 942 and 944, and current sources 952 and 954. For "low" to "medium" input signals, the collector currents in transistors 924 and 926 are roughly equal to one-half the current provided by current source 954.

As the input signal rises above the "low" level to "medium" signal levels, the voltage at the base of transistor 918 rises above the voltage at the base of transistor 916, beginning to turn ON transistor 918 and beginning to turn OFF transistor 916. The collector of transistor 918 conducts a first compensating current that causes a voltage drop primarily across resistor 901A (because resistor 901B is much smaller than resistor 901A), pulling down on $V_T$, and keeping that voltage from increasing above $V_{IL}$. Emitter resistor 928 increases the linear operating range of transistor 918. In this way, the adaptive threshold circuit 900 establishes a second predetermined relationship between $V_{IL}$ and $V_T$. In particular, $V_T$ is caused to be at a level that is a predetermined amount less than the level of $V_{IL}$ when the photo diode pulse is HIGH. The voltage difference between $V_{IL}$ and $V_T$ varies with the input signal amplitude. For example, if the current in transistor 918 is approximately 65 μA, and resistors 901A and 901B to 2 KΩ and 300 Ω, respectively, $V_T$ can be set to remain at least approximately 150 mV below the amplitude of $V_{IL}$ when the photo diode pulse is HIGH. The voltage difference between $V_{IL}$ and $V_T$ varies in an approximately linear manner with the input signal. The linearity is largely due to the presence of resistor 928.

Figure 11:
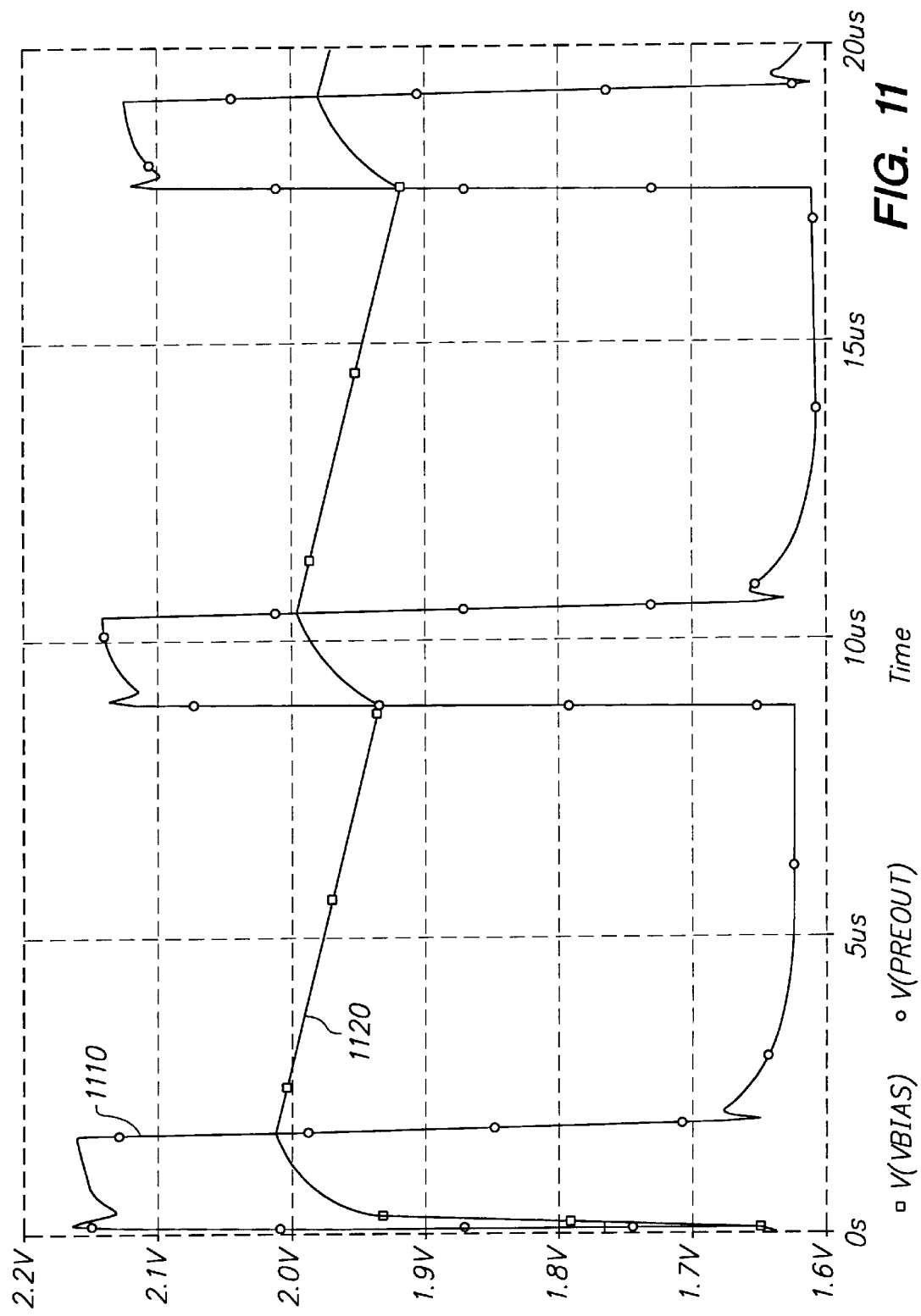
FIG. 11 is a graph showing voltage versus time characteristics of the inputs to the comparator of the circuitry of FIG. 9 for "medium level" input signals.

The operation of adaptive threshold circuit 900 for these "medium" signal levels is illustrated in FIG. 11. As $V_{IL}$ (trace 1110) increases in amplitude, $V_T$ (trace 1120) follows $V_{IL}$, minus the voltage drop across resistor 901A caused by transistor 918 beginning to turn ON. In the alternative embodiment of FIG. 9, for "medium" input signal levels, $V_T$ remains at least approximately 150 mV below the amplitude of $V_T$ when the photo diode pulse is HIGH. After the received light pulse ends, the input signal $V_{IL}$ drops back to its DC steady-state value. The output threshold voltage $V_T$ slowly decays toward its DC steady-state value due to the slow discharge of capacitor 912 by current source 906.

For "high" input signal levels, unlike the circuit operation for "medium" input signal levels, the output threshold voltage $V_T$ must be set closer to the peak voltage level of $V_{IL}$. In particular, where the photo diode and LED touch, the photo diode generates a high amplitude current with an exaggerated pulse width, as illustrated by trace 1200 in FIG. 12A. When photo diode 102 turns ON, its output current rises sharply and then becomes distorted. When the LED is turned OFF, the photo diode continues to conduct current due to the diffusion time constant of the hole-electron pairs generated outside the depletion region. At about 1.6 μsec, the light is turned OFF and the photo diode current increases to a peak amplitude of about 7.5 mA. After about 3.3 μsec, the photo diode current drops gradually to about 6.0 mA and then decays to about 100 μA about 8.7 μsec.

Figure 12A:
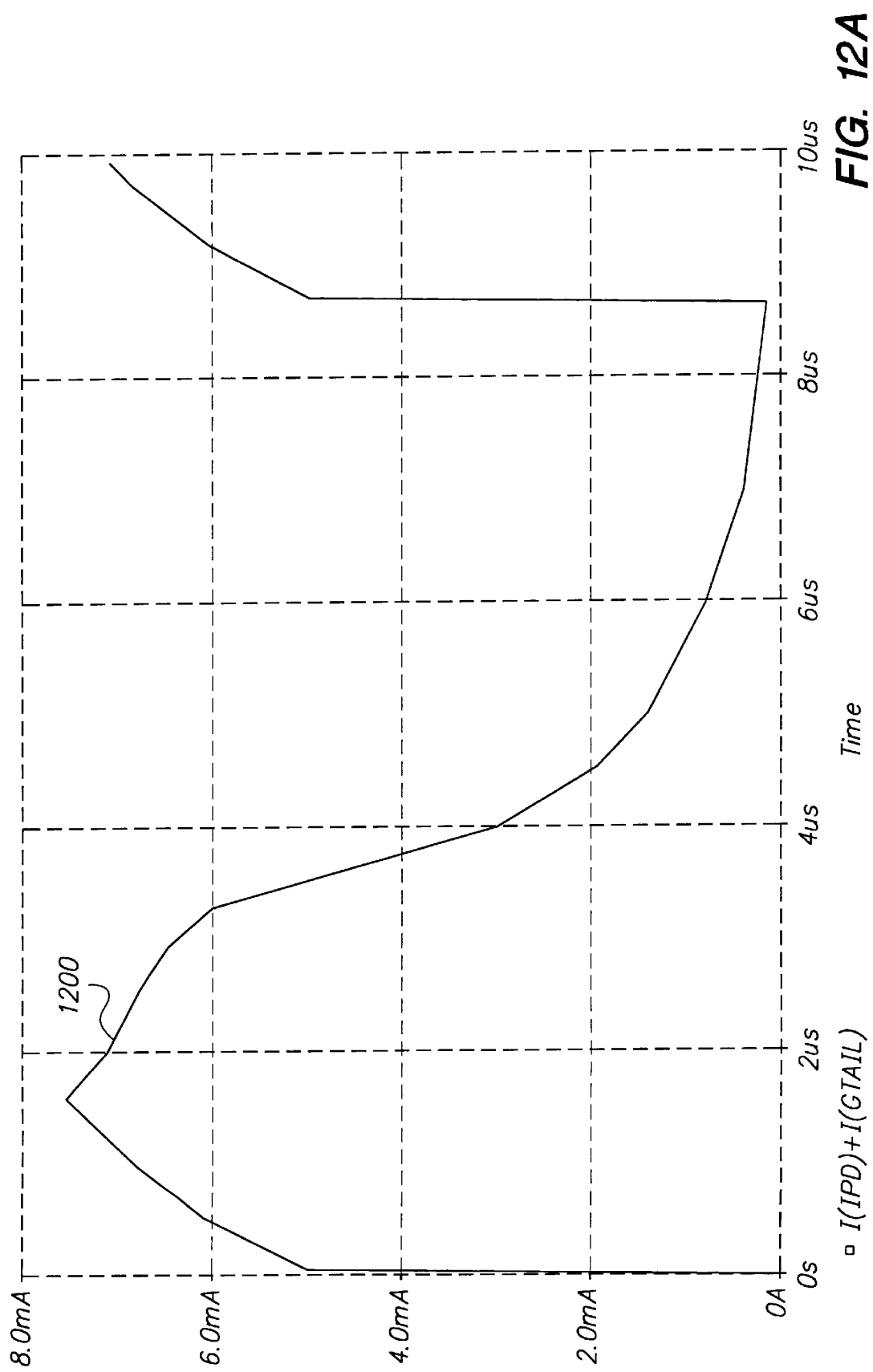
FIG. 12A is a graph showing current versus time response characteristic of a typical photo diode when the photo diode and LED touch.
Figure 12B:
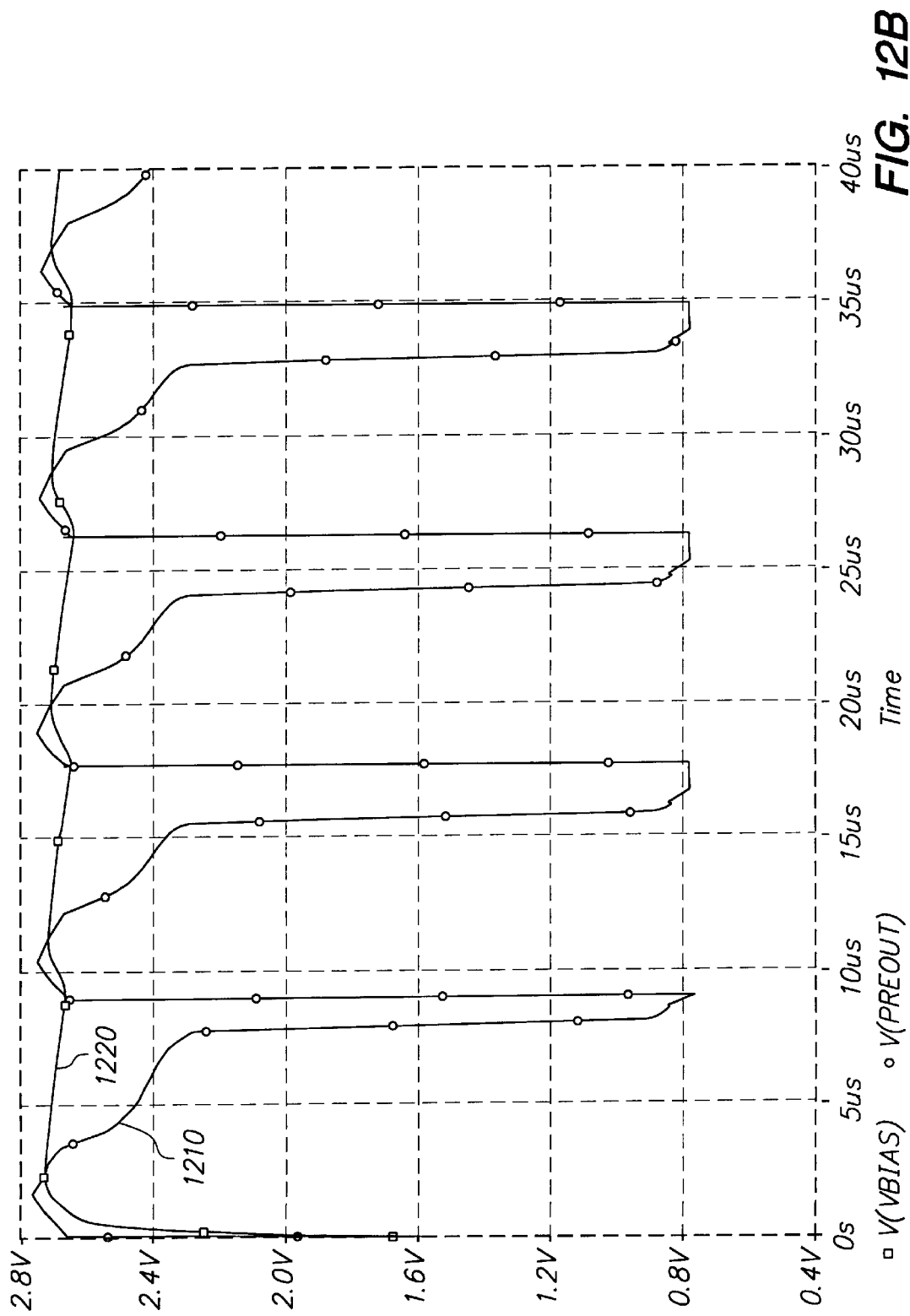
FIG. 12B is a graph showing voltage versus time characteristics of the inputs to the comparator of FIG. 9 for "high level" input signals produced when the photo diode and LED touch.

FIG. 12B shows the preamplifier output corresponding to the photo diode current shown in FIG. 12A. Trace 1210 shows the voltage characteristic versus time for the "high level" input signal $V_{IL}$ and trace 1220 shows the corresponding characteristic for output threshold voltage $V_T$. If the output threshold voltage for such large amplitude signals is at least a few hundred millivolts below the peak, the comparator's output pulse width is much larger than the pulse width of the received light pulse. Transistor 914, the NPN current mirror formed by transistors 920 and 922, and the switching network consisting of transistors 924 and 926, resistors 942 and 944, and current source 954 solve this problem in accordance with the principles of the present invention. At "high" signal levels, transistor 924 begins to turn OFF because the voltage at the emitter of transistor 914 is higher than the voltage at the base of transistor 926. As transistor 924 turns OFF, its collector current decreases, and by the action of the NPN current mirror, the collector current of transistor 918 also decreases. Transistor 924 thus conducts a second compensating signal that decreases the voltage drop across resistor 901A, thereby increasing output threshold voltage $V_T$. In this way, adaptive threshold circuit 900 establishes a third predetermined relationship between $V_{IL}$ and $V_T$. For example, by using the component values set forth in Table I, the output threshold voltage for "high" input signals is approximately 50 mV below the peak amplitude of $V_{IL}$ when the photo diode pulse is HIGH. Persons skilled in the art will recognize that in addition to resolving the above described problems that result when the photo diode and LED touch, the adaptive threshold circuit 900, like the adaptive threshold circuit 200, resolves the problems associated with "high" input signal levels in which the photo diode exhibits a "tail" after the received light pulse has ended.

In the embodiment shown in FIG. 9, the adaptive threshold circuit 900 establishes three predetermined relationships between $V_{IL}$ and $V_T$. Persons skilled in the art will appreciate that additional or other predetermined relationships may be added without departing from the spirit of the present invention. This may be accomplished, for example, by adding circuitry to further control the voltage dropped across resistor 901A, in response to either $V_{IL}$ or $V_T$, or both. In the embodiment shown in FIG. 9, all currents used to adjust the threshold voltage of comparator 190 are derived off of the same bias line for better matching.

The following table sets forth exemplary component and circuit values for the circuits shown in FIG. 2 and FIG. 9:

TABLE I

| Reference Number | Circuit Element | Value |
| --- | --- | --- |
| 108 | transistor | 10x |
| 140 | current source | 50 µA |
| 142 | resistor | 5 KΩ |
| 150 | resistor | 50 KΩ |
| 174 | resistor | 32 KΩ |
| 176 | capacitor | 500 pF |
| 178 | resistor | 32 KΩ |
| 179 | resistor | 2 KΩ |
| 180 | capacitor | 500 pF |
| 201 | resistor | 3 KΩ |
| 202 | transistor | 3x |
| 204 | transistor | 5x |
| 206 | current source | 10 µA |
| 208 | current source | 10 µA |
| 210 | resistor | 700Ω |
| 212 | capacitor | 95 pF |
| 214 | transistor | 1x |
| 215 | resistor | 115 KΩ |
| 216 | transistor | 1x |
| 218 | transistor | 1x |
| 220 | transistor | 1x |
| 222 | transistor | 1x |
| 224 | current source | 50 µA |
| 226 | current source | 50 µA |
| 234 | current source | 3 µA |
| 238 | transistor | 1x |
| 240 | transistor | 1x |
| 262 | resistor | 25Ω |
| 264 | transistor | 2x |
| 265 | transistor | 10x |
| 266 | transistor | 10x |
| 267 | resistor | 2.5 KΩ |
| 270 | transistor | 1x |
| 272 | transistor | 1x |
| 274 | resistor | 26 KΩ |
| 276 | resistor | 26 KΩ |
| 278 | transistor | 2x |
| 280 | voltage reference | 0.7V |
| 282 | transistor | 1x |
| 284 | transistor | 1x |
| 286 | transistor | 2x |
| 288 | resistor | 26 KΩ |
| 290 | resistor | 26 KΩ |
| 292 | transistor | 1x |
| 293 | resistor | 10 KΩ |
| 294 | transistor | 1x |
| 295 | resistor | 10 KΩ |
| 296 | transistor | 1x |
| 297 | transistor | 1x |
| 298 | transistor | 1x |
| 299 | transistor | 1x |
| 901A | resistor | 2 KΩ |
| 901B | resistor | 300Ω |
| 902 | transistor | 6x |

TABLE I-continued

| Reference Number | Circuit Element | Value |
| --- | --- | --- |
| 904 | transistor | 6x |
| 906 | current source | 10 µA |
| 908 | current source | 10 µA |
| 910 | resistor | 500Ω |
| 911 | resistor | 25Ω |
| 912 | capacitor | 1000 pF |
| 914 | transistor | 1x |
| 916 | transistor | 1x |
| 918 | transistor | 1x |
| 920 | transistor | 2x |
| 922 | transistor | 1x |
| 924 | transistor | 1x |
| 926 | transistor | 1x |
| 928 | resistor | 1 KΩ |
| 940 | controlled current source | 10 µA |
| 942 | resistor | 3 KΩ |
| 944 | resistor | 3 KΩ |
| 946 | voltage reference | 1.80V |
| 950 | voltage reference | 1.54V |
| 952 | current source | 10 µA |
| 954 | current source | 50 µA |

Persons skilled in the art will recognize that the circuitry of the present invention may be implemented using circuit configurations other than those shown and discussed above. All such modifications are within the scope of the present invention, which is limited only by the claims which follow.

I claim:

1. An adaptive threshold circuit that generates first and second output signals, at least one of which varies responsive to an input signal applied to the adaptive threshold circuit comprising:

an input signal node to which the input signal is applied;

first and second signal paths coupled to the input signal node, the first signal path having a first output node at which the first output signal is generated responsive to the input signal, and the second signal path having a second output node at which the second output signal is generated responsive to the input signal, wherein proportioned values of circuit elements in the first and second signal paths establish a first predetermined relationship between the first and second output signals;

a third signal path coupled to a first bias signal node and to at least one of the first and second signal paths, the third signal path conducting a first compensating signal responsive to the input signal comparing in a predetermined manner to a bias signal at the first bias signal node, the first compensating signal establishing a second predetermined relationship between the first and second output signals;

a fourth signal path coupled to at least one of the first and second signal paths, the fourth signal path conducting a second compensating signal responsive to (a) the first and second output signals comparing in a predetermined manner to one another, and (b) at least one of the first and second output signals comparing in a predetermined manner to a bias signal, the second compensating signal establishing a third predetermined relationship between the first and second output signals.

2. The adaptive threshold circuit of claim 1, wherein the fourth signal path is coupled to the first bias signal node, and wherein the fourth signal path conducts the second compensating signal responsive to (a) the first and second output signals comparing in a predetermined manner to one another, and (b) at least one of the first and second output signals comparing in a predetermined manner to a bias signal at the first bias signal node.

3. The adaptive threshold circuit of claim 1, wherein the fourth signal path is coupled to a second bias node, and wherein the fourth signal path conducts the second compensating signal responsive to (a) the first and second output signals comparing in a predetermined manner to one another, and (b) at least one of the first and second output signals comparing in a predetermined manner to a bias signal at the second bias signal node.

4. The adaptive threshold circuit of claim 1, wherein the first signal path comprises a first transistor and the second signal path comprises a second transistor.

5. The adaptive threshold circuit of claim 4, wherein the first predetermined relationship is determined in part by a ratio of the size of the first transistor to the size of the second transistor.

6. The adaptive threshold circuit of claim 4, wherein:
the first signal path further comprises a first current source that conducts a first current; and
the second signal path further comprises a second current source that conducts a second current.

7. The adaptive threshold circuit of claim 6, wherein:
the first transistor conducts a substantial portion of the first current and the second transistor conducts a substantial portion of the second current; and
the first predetermined relationship is determined in part by the ratio of the first current to the second current.

8. The adaptive threshold circuit of claim 6, wherein:
the first and second transistors each have a base and an emitter;
the input signal node is coupled to the base of the first transistor and the base of the second transistor; and
the emitter of the first transistor is coupled to the first output node and the emitter of the second transistor is coupled to the second output node.

9. The adaptive threshold circuit of claim 8, wherein:
the first predetermined relationship is determined in part by a difference between a base-emitter voltage of the first transistor and a base-emitter voltage of the second transistor.

10. The adaptive threshold circuit of claim 8, wherein:
the first predetermined relationship is determined in part by a ratio of a base-emitter junction area of the first transistor to a base-emitter junction area of the second transistor.

11. The adaptive threshold circuit of claim 8, wherein:
the first transistor has a collector that conducts a substantial portion of the first current;
the second transistor has a collector that conducts a substantial portion of the second current; and
the first predetermined relationship is determined in part by a ratio of the collector current of the first transistor to the collector current of the second transistor.

12. The adaptive threshold circuit of claim 8, wherein:
the first current source is coupled between the first output node and ground; and
the second current source is coupled between the second output node and ground.

13. The adaptive threshold circuit of claim 12, wherein:
the first predetermined relationship is determined in part by a difference between a base-emitter voltage of the first transistor and a base-emitter voltage of the second transistor.

14. The adaptive threshold circuit of claim 12, wherein:
the first predetermined relationship is determined in part by a ratio of a base-emitter junction area of the first transistor to a base-emitter junction area of the second transistor.

15. The adaptive threshold circuit of claim 12, wherein:
the first transistor and the second transistor each have a collector connected to a power supply;
the first transistor has a collector current substantially equal to the first current;
the second transistor has a collector current substantially equal to the second current; and
the first predetermined relationship is determined in part by a ratio of the collector current of the first transistor to the collector current of the second transistor.

16. The adaptive threshold circuit of claim 6, wherein:
the first and second transistors each have a base and an emitter;
the input signal node is coupled to the base of the first transistor and the base of the second transistor;
a first resistor is coupled between the emitter of the first transistor and the first output node; and
a second resistor is coupled between the emitter of the second transistor and the second output node.

17. The adaptive threshold circuit of claim 16, wherein the first predetermined relationship is determined in part by a difference between resistance values of the first resistor and the second resistor.

18. The adaptive threshold circuit of claim 16, wherein:
the first current source is coupled between the first output node and ground; and
the second current source is coupled between the second output node and ground.

19. The adaptive threshold circuit of claim 1, wherein the third signal path comprises a third transistor.

20. The adaptive threshold circuit of claim 19, wherein the third signal path further comprises a third current source conducting a third current.

21. The adaptive threshold circuit of claim 20 wherein:
the third transistor conducts a substantial portion of the third current; and
the first compensating signal is determined in part by the magnitude of the third current.

22. The adaptive threshold circuit of claim 21 wherein:
the third signal path further comprises a third resistor that conducts a substantial portion of the third current; and
the first compensating signal is further determined in part by a voltage across the third resistor.

23. The adaptive threshold circuit of claim 8 wherein:
the third signal path comprises (a) a third current source conducting a third current, (b) a third transistor having a base, a collector and an emitter, and (c) a third resistor;
the third transistor and third resistor each conduct a substantial portion of the third current;
the third resistor is coupled between the input node, the base of the second transistor and the collector of the third transistor;
the first output node is coupled to the base of the third transistor;
the emitter of the third transistor is coupled to the third current source; and
the first compensating signal is determined in part by the magnitude of the third current and a voltage across the third resistor.

24. The adaptive threshold circuit of claim 1, wherein the fourth signal path comprises a fourth transistor.

25. The adaptive threshold circuit of claim 24, wherein the fourth signal path further comprises a fourth current source conducting a fourth current.

26. The adaptive threshold circuit of claim 25 wherein:
the fourth transistor conducts a substantial portion of the fourth current; and
the second compensating signal is determined in part by the magnitude of the fourth current.

27. The adaptive threshold circuit of claim 26 wherein:
the fourth signal path further comprises a fourth resistor that conducts a substantial portion of the fourth current; and
the second compensating signal is further determined in part by a voltage across the fourth resistor.

28. The adaptive threshold circuit of claim 23 wherein:
the fourth signal path comprises (a) a fourth current source conducting a fourth current, (b) a fourth transistor having a base, a collector, and an emitter, and (c) a fourth resistor;
the fourth transistor and fourth resistor each conduct a substantial portion of the fourth current;
the fourth resistor is coupled between the input node, the base of the second transistor, and the collector of the third transistor; and
the second compensating signal is determined in part by the magnitude of the fourth current and a voltage across the fourth resistor.

29. The adaptive threshold circuit of claim 28 wherein:
the emitter of the fourth transistor is coupled to the fourth current source; and
the base of the fourth transistor is coupled to the second output node.

30. The adaptive threshold circuit of claim 29 wherein:
the collector of the fourth transistor is coupled to the fourth resistor and the base of the second transistor.

31. The adaptive threshold circuit of claim 25 wherein:
the fourth transistor conducts a substantial portion of the fourth current and has a base, a collector, and an emitter;
the fourth signal path further comprises a fourth resistor that is coupled between the input node, the base of the second transistor, and the collector of the third transistor;
the collector of the fourth transistor is coupled to a power supply;
the emitter of the fourth transistor is coupled to the third current source; and
the fourth current source is coupled between the emitter of the fourth transistor and ground.

32. The adaptive threshold circuit of claim 31 wherein:
the fourth signal path further comprises a fifth current source, a fifth transistor and a sixth transistor;
the fifth transistor has a collector coupled to the third current source, a base coupled to the emitter of the fourth transistor, and an emitter coupled to the fifth current source;
the sixth transistor has a collector coupled to ground, a base coupled to a second bias node, and an emitter coupled to the fifth current source; and
the magnitude of the third current is substantially proportional to the collector current of the fifth transistor.

33. The adaptive threshold circuit of claim 32 wherein:
the third current source comprises a seventh transistor having a collector, a base, and an emitter coupled to ground;
the fourth signal path further comprises an eighth transistor having a collector, a base, and an emitter coupled to ground;
the collector and base of the eighth transistor are coupled together to form a diode-connected current source, and are coupled to the collector of the fifth transistor; and
the base of the seventh transistor is coupled to the base of the eighth transistor.

34. The adaptive threshold circuit of claim 1, wherein the adaptive threshold circuit is implemented as integrated circuitry.

35. The adaptive threshold circuit of claim 1, wherein a photo diode produces the input signal.

36. The adaptive threshold circuit of claim 35, wherein a photo diode preamplifier provides the input signal to the adaptive threshold circuit.

37. The adaptive threshold circuit of claim 36, wherein the photo diode preamplifier has a transconductance block.

38. The adaptive threshold circuit of claim 37, wherein the photo diode preamplifier, transconductance block, and adaptive threshold circuit are implemented as integrated circuitry.

39. The adaptive threshold circuit of claim 1, wherein the adaptive threshold circuit further comprises a hysteresis circuit.

40. The adaptive threshold circuit of claim 39, wherein the hysteresis circuit comprises a fifth signal path coupled to the input signal node, at least one of the first and second signal paths, and the first and second output signal nodes, the fifth signal path conducting a third compensating signal responsive to the first and second output signals comparing in a predetermined manner to one another, the third compensating signal establishing a fourth predetermined relationship between the first and second output signals.

41. The adaptive threshold circuit of claim 40, wherein the fifth signal path comprises a ninth transistor coupled to the input signal node and at least one of the first and second signal paths.

42. The adaptive threshold circuit of claim 41, wherein the fifth signal path further comprises a sixth current source that conducts a sixth current.

43. The adaptive threshold circuit of claim 42, wherein:
the ninth transistor conducts a substantial portion of the sixth current; and
the third compensating signal is determined in part by the magnitude of the sixth current.

44. The adaptive threshold circuit of claim 43, wherein:
the fifth signal path further comprises a fifth resistor coupled between the input signal node and at least one of the first and second signal paths, the fifth resistor conducting a substantial portion of the sixth current; and
the third compensating signal is determined in part by the magnitude of the sixth current and the voltage across the fifth resistor.

45. An adaptive threshold generating method for generating first and second output signals, at least one of which varies responsive to an input signal, the method including the steps of:
providing an input signal at an input signal node;
coupling first and second signal paths to the input signal node, the first signal path having a first output node and the second signal path having a second output node, and providing the first and second signal paths with proportioned circuit elements;

generating at the first output node a first output signal responsive to the input signal and generating at the second output node a second output signal responsive to the input signal, wherein the proportioned values of the circuit elements in the first and second signal paths establish a first predetermined relationship between the first and second output signals;

coupling a third signal path to a first bias signal node and to at least one of the first and second signal paths, the third signal path conducting a first compensating signal when the input signal compares in a predetermined manner to a bias signal at the first bias signal node, the first compensating signal establishing a second predetermined relationship between the first and second output signals;

coupling a fourth signal path to at least one of the first and second signal paths, the fourth signal path conducting a second compensating signal responsive to (a) the first and second output signals comparing in a predetermined manner to one another, and (b) at least one of the first and second output signals comparing in a predetermined manner to a bias signal, the second compensating signal establishing a third predetermined relationship between the first and second output signals.

46. The adaptive threshold generating method of claim 45, further comprising the steps of coupling the fourth signal path to the first bias signal node, the fourth signal path conducting the second compensating signal responsive to (a) the first and second output signals comparing in a predetermined manner to one another, and (b) at least one of the first and second output signals comparing in a predetermined manner to a bias signal at the first bias signal node.

47. The adaptive threshold circuit of claim 45, further comprising the steps of coupling the fourth signal path to a second bias node, the fourth signal path conducting the second compensating signal responsive to (a) the first and second output signals comparing in a predetermined manner to one another, and (b) at least one of the first and second output signals comparing in a predetermined manner to a bias signal at the second bias signal node.

* * * * *